(12) United States Patent
Hyland

(10) Patent No.: US 12,156,366 B2
(45) Date of Patent: *Nov. 26, 2024

(54) UNDERWATER DATA CENTERS WITH ENVIRONMENTAL INFORMATION SYSTEM

(71) Applicant: Brendan Hyland, Edinburgh (GB)

(72) Inventor: Brendan Hyland, Edinburgh (GB)

( * ) Notice: Subject to any disclaimer, the term of this patent is extended or adjusted under 35 U.S.C. 154(b) by 135 days.

This patent is subject to a terminal disclaimer.

(21) Appl. No.: 17/943,171

(22) Filed: Sep. 12, 2022

(65) Prior Publication Data

US 2024/0090159 A1    Mar. 14, 2024

(51) Int. Cl.
*H05K 7/14* (2006.01)
*H05K 7/20* (2006.01)

(52) U.S. Cl.
CPC ......... *H05K 7/1497* (2013.01); *H05K 7/1491* (2013.01); *H05K 7/2079* (2013.01)

(58) Field of Classification Search
None
See application file for complete search history.

(56) References Cited

U.S. PATENT DOCUMENTS

| | | | | |
|---|---|---|---|---|
| 11,711,135 B1 * | 7/2023 | Gajjar | ................ | H04B 7/18513 |
| | | | | 370/316 |
| 2015/0194813 A1 * | 7/2015 | Finn | ..................... | H05K 7/1497 |
| | | | | 307/19 |
| 2016/0378981 A1 * | 12/2016 | Cutler | .................. | A01K 67/033 |
| | | | | 726/23 |
| 2024/0083561 A1 * | 3/2024 | Hyland | .................. | B63C 11/52 |
| 2024/0088639 A1 * | 3/2024 | Hyland | ................ | H05K 7/2079 |
| 2024/0088669 A1 * | 3/2024 | Hyland | ...................... | H02J 3/38 |
| 2024/0090161 A1 * | 3/2024 | Hyland | .............. | H05K 7/20709 |
| 2024/0090162 A1 * | 3/2024 | Hyland | ................ | H05K 7/1497 |

FOREIGN PATENT DOCUMENTS

| | | | | |
|---|---|---|---|---|
| CN | 110203333 A | * | 9/2019 | ............. B63B 22/00 |
| CN | 113742653 A | * | 12/2021 | |
| CN | 114649808 A | * | 6/2022 | |

OTHER PUBLICATIONS

CN-114649808-A English Language Translation (Year: 2022).*
CN-113742653-A English Language Translation (Year: 2021).*
CN-110203333-A English Language Translation (Year: 2019).*

* cited by examiner

*Primary Examiner* — Curtis A Kuntz
*Assistant Examiner* — Jerold B Murphy

(57) ABSTRACT

An underwater data center includes a plurality of data centers positioned in a water environment, powered by one or more sustainable energy sources. One or more data center nodes is coupled to the data center or included in the plurality of data centers. A controller is coupled to the one or more data center nodes. An environmental information is included.

19 Claims, 23 Drawing Sheets

UNDERWATER DATA CENTERS WITH ENVIRONMENTAL INFORMATION SYSTEM

BACKGROUND

Field of the Invention

This invention relates generally to systems with an underwater data center system, and more particularly an underwater date center system 10 with an environmental information system.

Brief Description of the Related Art

Data centers make digital lives possible. Each year they consume more than two percent of all power generated and cost an estimated $1.4 billion to keep them cool.

Data centers are centralized locations that, at a very basic level, house racks of servers that store data and perform computations. They make possible bitcoin mining, real-time language translation, Netflix streaming, online video games, and processing of bank payments among many other things. These server farms range in size from a small closet using tens of kilowatts (kW) to warehouses requiring hundreds of megawatts (MW).

Data centers need a good deal of energy. Not just to power the servers, but also for auxiliary systems such as monitoring equipment, lighting, and most importantly: cooling. Computers rely on many, many, transistors which also act as resistors. When a current passes through a resistor, heat is generated—just like a toaster. If the heat is not removed it can lead to overheating, reducing the efficiency and lifetime of the processor, or even destroying it in extreme cases. Data centers face the same problem as a computer on a much larger scale.

Data centers exist to store and manage data, so any power used by the facility for other purposes is considered 'overhead'. A helpful metric way to measure a facility's power overhead is with the power usage effectiveness (PUE) ratio. It is the ratio of the total facility power to the IT equipment power. A PUE of one would mean that the facility has zero power overhead whereas a PUE of 2 would mean that for every watt of IT power an additional watt is used for auxiliary systems.

More than half the world's population lives within 120 miles of the coast. By putting datacenters underwater near coastal cities, data would have a short distance to travel, leading to fast and smooth web surfing, video streaming and game playing.

The consistently cool subsurface seas allow for energy-efficient datacenter designs. For example, they can leverage heat-exchange plumbing such as that found on submarines.

Most data centers are air cooled. Air cooling works moderately well, but not as well as water cooling. This is due to simple fact that water has a specific heat capacity that is more than four times that of air. In other words, water cooling is more efficient and better efficiency means less costs.

Underwater data centers exist. There are several benefits to an underwater data center, including but not limited to passive cooling.

Satellite surveillance systems are increasingly used for environmental surveillance but many sensors are limited to information from a water surface. Subsea sensors provide reliable information in the water column but are expensive for wide deployment There is a need for an underwater data center with an environmental information system.

SUMMARY

An object of the present invention is to provide a system with an underwater data center powered by one or more sustainable energy sources.

Another object of the present invention is to provide a system with an underwater data center powered by a renewable energy source and uses passive cooling.

A further object of the present invention is to provide a system powered by a renewable energy source selected from one or more of: renewable energy; off shore energy generation; wind; wave; tidal; hydroelectric; solar; geothermal; conversion of energy to one or more of hydrogen, or ammonia.

Still another object of the present invention is to provide an underwater data center with an environmental information system. System that includes a plurality of underwater data centers.

These and other objects of the present invention are achieved in an underwater data center with a plurality of data centers positioned in a water environment, powered by one or more sustainable energy sources. One or more data center nodes is coupled to the data center or included in the plurality of data centers. A controller is coupled to the one or more data center nodes. A housing member houses the data center node under water. An environmental information is included.

DETAILED DESCRIPTION

Figure 1A:
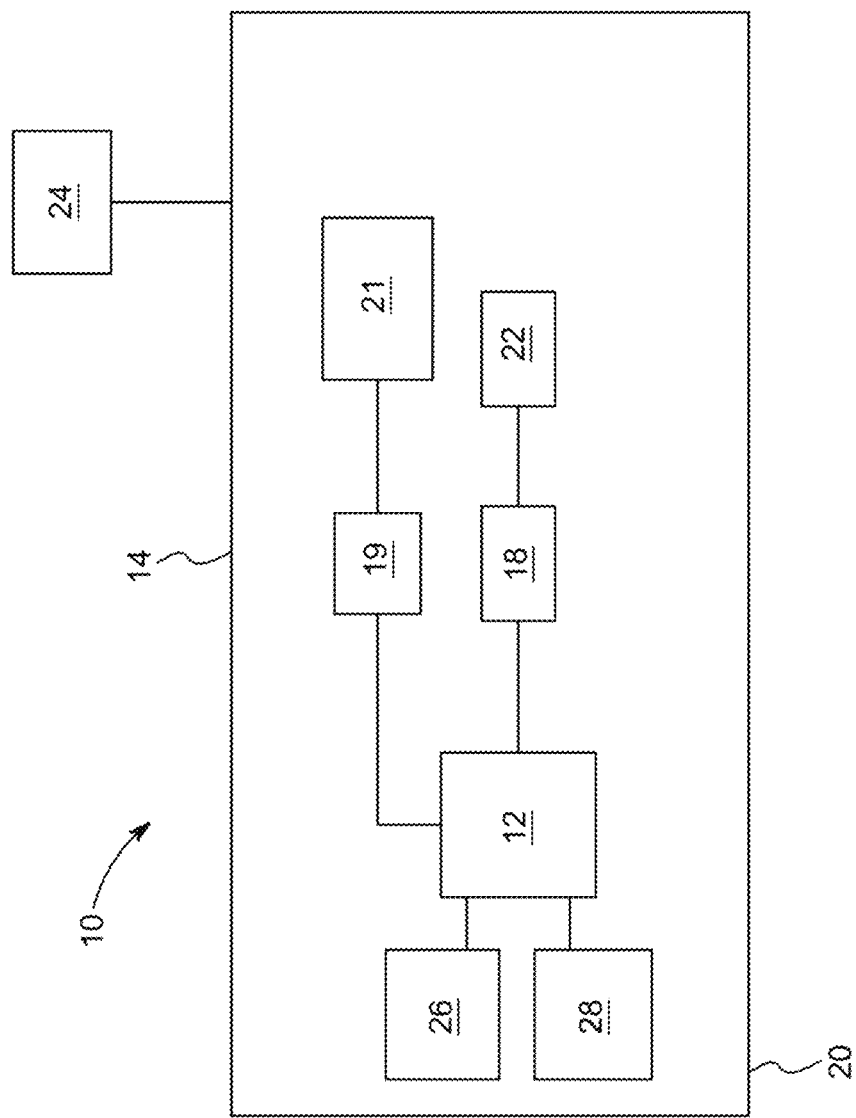
FIG. 1A is a vertical cross-section illustrating one embodiment of an underwater data center node of the present invention.

In one embodiment, illustrated in FIG. 1A, an underwater data center system 10 is provided. A data center node 12 positioned in a water environment 14, powered by one or more sustainable energy sources 24. The data center node 12 can include: one of more electronic devices 18. An optional enclosure 20 houses the electronic device 18 and the data center node 12 under water in the water environment 14. Optionally a heat exchanger 22 vent, or other equivalent structure to transfer heat, is provided an enclosure 20. The heat exchanger, where provided, 22 discharges, into the water environment 14, heat discharged from the electronic device 18. The data center node 12 is configured to be coupled to a sustainable energy source 24. As non-limiting examples, suitable heat exchangers 22 include but not limited to: adiabatic wheel heat, double pipe heat, dynamic scraped surface heat, fluid heat, phase-change, pillow plate, plate and shell, plate fin, plate, shell and tube, waste heat recovery unit, and the like.

In one embodiment, data center node 12 is located in water that is powered by one or more sustainable energy sources. As used herein sustainable energy includes but is not limited to energies such as renewable energy sources, off shore energy generation, wind, wave, tidal, hydroelectric power, solar, geothermal energy, conversion of energy to one or more of hydrogen, ammonia and the like In one embodiment, offshore energy generation is coupled to or includes smart wireless devices, be above or below water to enable improved automation and partial or fully autonomous operations, thereby reducing carbon footprint In one embodiment, data center node 12 is configured to operate with reduced data load by using an architecture with one or more of some and all data being processed at the source to information which is transferred to the data center nodes 12, thereby reducing carbon footprint.

In one embodiment, data center node 12 uses wireless link to remove costs and carbon footprint of hard wired (fiber or copper) link. As a non-limiting example, the data center nodes 12 uses edge processing.

In one embodiment, system 10 is provided with underwater data center node 12, which can be a server or equivalent, that can be installed under the sea, river, and the like, and used in an environment in which it is surrounded by, as a non-limiting example, sea water (SW). There is no limitation to the location where the underwater data center node 12 is installed so long as the location is under water, and instead of under the sea, for example, may be in a lake or a pond, or may be in a river.

In one embodiment, the underwater data center node 12 includes an electronic device 18. As a non-limiting example, the electronic device 18 is housed in an enclosure 20. The electronic device 18 includes, for example, a storage device that stores data, a transceiver that exchanges data with an external device, a processing device that performs predetermined processing on data, a controller 19 that controls the exchange of data and so on.

As a non-limiting example, data center node 12 is coupled to a sustainable energy source that provides energy to the data center node 12. The controller 19 is configured to redistribute excess power from the sustainable energy source to an alternate source responsive to determining that the power from the sustainable energy source is greater than an amount needed to power the system. In one embodiment, the alternate source is at least one of a battery storage device or the power grid. In one embodiment, the controller 19 is further configured to selectively turn off or on and throttle one of the one or more, ws 21 responsive to determining that the power provided by the sustainable energy source is insufficient to power the system 10.

As a non-limiting example, there is no particular limitation to specific examples of a transceiver of the electronic device 18. For example, in an underwater data center node 12 provided with an antenna 26, a transceiver 28 may perform wireless data exchange. The transceiver 28 may also have a structure that performs wired data exchange using a cable 30. In one embodiment the propagation path is through the wall of enclosure 20. In an underwater data center node 12 having a structure that performs wired data exchange, communication cable 30 extends from the electronic device 18, passes through the enclosure 20, and extends to outside the enclosure 20. As a non-limiting example, data communications and power transfer to and from enclosure 20 are wireless.

In one embodiment, the electronic device 18 includes a fan (not illustrated in the drawings). The fan may optionally be passive or actively driven. Driving the fan enables fluid inside the enclosure 20 to be introduced into the electronic device 18 and gas to be discharged from the electronic device 18 into the enclosure 20. In one embodiment, enclosure is be filled with dry nitrogen, another gas, a liquid or a high thermal conductivity, low coefficient of expansion solid that provides mechanical strength to enclosure 20

Driving the fan passes gas through the electronic device 18 to cool the electronic device 18. However, there are other methods and devices for cooling electronic device 18. As a non-limiting example, all cooling is passive.

As a non-limiting example, the fluid inside the enclosure 20 is, for example, air. Alternatively, a gas in which the nitrogen gas mixture ratio has been increased by a predetermined proportion compared to air may be employed so as to increase an anticorrosive effect inside the enclosure 20. Alternatively, a fluid which has low electrical conductivity may be employed.

As a non-limiting example, there is no limitation to the shape of the enclosure 20 so long as it is able to house the electronic device 18. In the example illustrated in FIG. 1A, the enclosure 20 has a rectangular box shape. Instead of such a rectangular shape, the enclosure 20 may, for example, have a spherical shape or circular tube shape cylindrical shape or an angular tube shape, or may have a hemispherical shape.

In one embodiment, power for the electronic device 18 can be supplied from the outside of the enclosure 20 using wireless power transfer through the enclosure 20, thereby reducing cost and carbon footprint.

In one embodiment, communications for the electronic device 18 can be supplied from the outside of the enclosure 20 wirelessly using one or more of electromagnetic and magnetic communication through the enclosure 20, thereby reducing cost and carbon footprint.

In one embodiment, power for the electronic device 18 can be supplied from the outside of the enclosure 20 using a power cable. In such a case, in addition to the communication cable described above, the power cable also passes through the enclosure 20. Portions where such various cables pass through the enclosure 20 are sealed by a sealing member or the like such that sea water SW does not inadvertently ingress into the enclosure 20.

Power for the electronic device 18 may be supplied using a tidal generator that employs tidal forces in the sea water.

As a non-limiting example, heat from the electronic device 18 is discharged to the outside of the underwater data center node 12 by one or more of the enclosure walls 20 and by the heat exchanger 22 or the like. Since the underwater data center node 12 is installed under water, the heat conversion efficiency of the underwater data center node 12 is higher than that of a data center node 12 installed, for example, in open air. As a non-limiting example, in the underwater data center node 12 it is possible to secure high performance cooling of the electronic device 18 at reduced energy consumption, thereby reducing cost and carbon footprint As a non-limiting example, the underwater data center node 12 can be used to reduce the amount of the data sent to the cloud. Data is processed at the edge in order to reduce the carbon footprint. Because energy is consumed every time data of is moved, system 10 processes as much data at the edge. Energy is consumed every time data is moved. System 10 processes and collapses the data underwater to reduce the amount of energy used for data communications thereby reducing the energy required too thermally cool.

Next to the data center nodes 12 can be a 'subsea butterfly field'. This is an area where fauna and flora are actively regenerated through replanting of seagrass, seaweeds etc to attract sea life thereby increasing biodiversity and increasing the rate of carbon sequestration. The 'subsea butterfly field' may be sized to fully offset the carbon footprint of the subsea data center nodes 12.

Figure 1B:
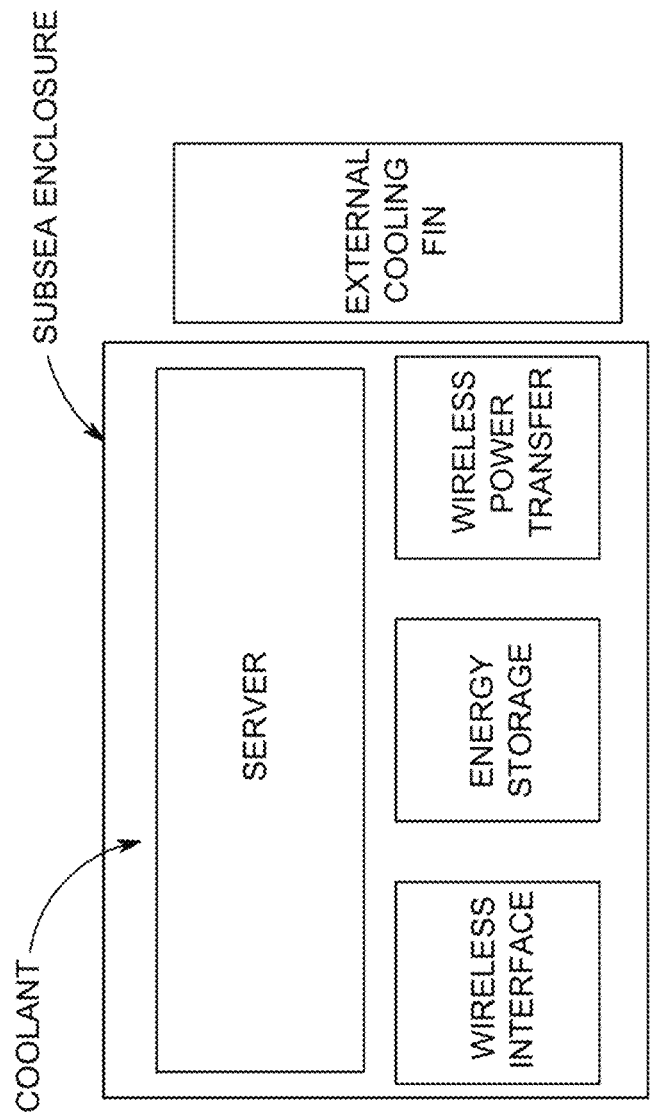
FIG. 1B illustrated one embodiment of an underwater data center node that includes a subsea enclosure, coolant, server, wireless interface, energy, wireless power transfer and an optional external cooling fin.

In one embodiment, illustrated in FIG. 1B, an underwater data center node 12 includes a subsea enclosure (enclosure 20), coolant, data center node 12, wireless interface, energy, wireless power transfer and, optionally, an external cooling fin.

As non-limiting examples, a subsea enclosure depth be can 10 m-500 m; enclosure 20 material is having low electrical conductivity and is stable in water, e.g., glass, glass composite, acetyl and the like. The enclosure 20 can be sealed-for-life in that it has: no O-ring seals; external penetrations; and the like. The enclosure material may be selected or treated to minimise growth of biofouling thereby reducing the carbon footprint of maintenance of the enclosure. As a non-limiting example, the data centre 12 can be an electronic and/or optoelectronic subsystems for data processing, information processing, ML, AI, storage (memory), and the like.

As a non-limiting example, the wireless interface includes one or more high bandwidth EM comms methods, such as 1 Gbps-1 Tbps, microwave; and low bandwidth, low energy EM for control e.g., Bluetooth. In one embodiment, the wireless power transfer can be 100 W-1 kW using as a non-limiting example inductive power transfer. The energy storage can provide stability and security. The external cooling fin is optional.

Energy storage can include a variety of different methods/technologies.

Energy storage is the capture of energy produced at one time for use at a later time[1] to reduce imbalances between energy demand and energy production. A device that stores energy is generally called an accumulator or battery. Energy comes in multiple forms including radiation, chemical, gravitational potential, electrical potential, electricity, elevated temperature, latent heat and kinetic. Energy storage involves converting energy from forms that are difficult to store to more conveniently or economically storable forms.

As non-limiting examples, energy storage includes but is not limited to the following:

Fossil fuel storage.

Mechanical including but not limited to, spring Compressed air energy storage (CAES), fireless locomotive, flywheel energy storage, solid mass gravitational, Hydraulic accumulator Pumped-storage hydroelectricity (pumped hydroelectric storage, PHS, or pumped storage hydropower, PSH)

Thermal Expansion.

Electrical, electromagnetic including but not limited to, capacitor, supercapacitor, superconducting magnetic energy storage (SMES, superconducting storage coil), and the like Biological including but not limited to, glycogen, starch and the like.

Electrochemical (Battery Energy Storage System, BESS), including but not limited to: flow battery, rechargeable battery, ultra-battery and the like.

Thermal including but not limited to: brick storage heater, cryogenic energy storage, liquid air energy storage (laes), liquid nitrogen engine, eutectic system, ice storage air conditioning, molten salt storage, phase-change material, and the like.

Seasonal thermal energy storage including but not limited to, solar pond, steam accumulator, thermal energy storage (general), and the like.

Chemical including but not limited to, biofuels, hydrated salts, hydrogen storage, hydrogen peroxide, power to gas, vanadium pentoxide, and the like.

In one embodiment, in order to maintain temperature stability, the enclosure 20 can be made of glass, a composite, metal, and the like. The enclosure material may be selected for good thermal conductivity. The enclosure wall may be sized so that the thermal enclosure acts as a heat exchanger. In one embodiment, the high thermal subsystems have close contact with a wall next adjacent to the fin. In one embodiment, the coolant is: high thermal conducting; and electrically insulating liquid; gas or multi-phase and the like.

Figure 1C:
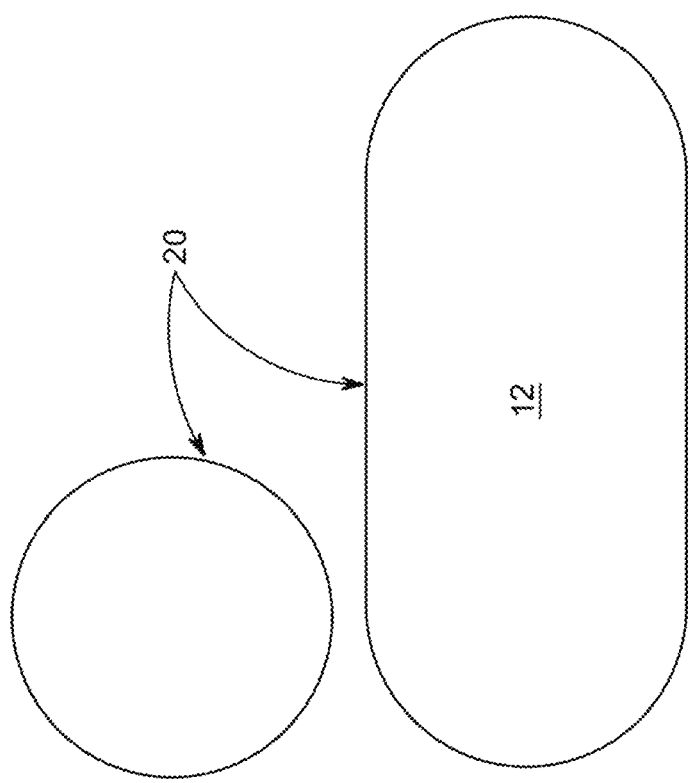
FIG. 1C illustrates one embodiment of a sealed for life data center node.

FIG. 1C illustrates one embodiment of a sealed for life data center node 12. As non-limiting examples: spheres or cylinders can be used in order to provide strength in water; the materials can be glass, a glass composite or acetyl or PEEK or the like; low electrical conductivity. They can have a depth rating of 10-500 m, a wall thickness of 0.5-2 cm, and the like. Enclosure 20 may be sealed for life through use of fusing or glue or injection moulding or the like.

Figure 1D:
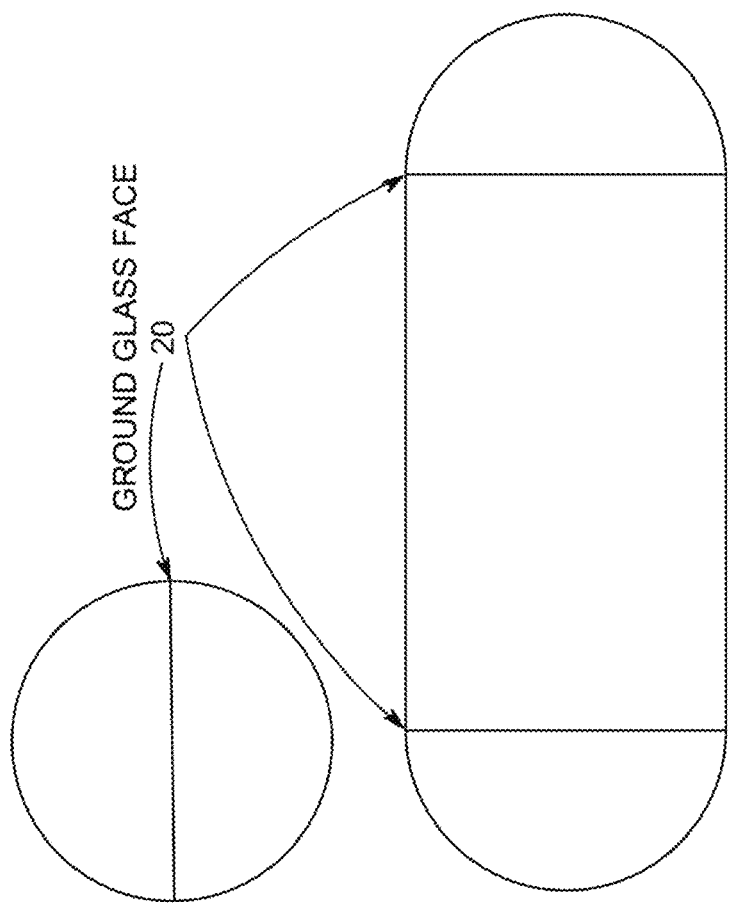
FIG. 1D illustrates one embodiment of a data center node wherein enclosure incorporates seals.

FIG. 1D illustrates one embodiment of a data center node enclosure 20 with seals. As non-limiting examples: spheres or cylinders can be used in order to provide strength in water; the materials can be glass, a glass composite or the like; low electrical conductivity. They can have a depth rating of 10-500 m, a wall thickness of 0.5-2 cm, and the like. Hemispheres can be sealed using ground faces, matched and sealed using standard methods, and held together automatically by water pressure. This provides a lower cost than O-rings Glass is not as good of a thermal coolant as metal. A normal glass K=1 W/m·K. In one embodiment glass or glass composite is selected for good thermally conductivity aid cooling. Glass wall thickness may be sized to balance strength with cooling. Enclosure 20 may be filled with a thermally conductivity material including and electrically insulating gas or liquid or solid to aid cooling. In one embodiment the enclosure 20 may be 'potted' with a solid to provide protection against water ingress thereby enabling the enclosure to be of lower cost. In one embodiment, a high relative surface area of a sphere benefits cooling. In one embodiment, electronics are sealed in thin-walled sphere then placed in a mould and glass injected round to provide sealing-for-life. In one embodiment, glass injection can be in single or multiple stages to minimise heat-induced stress on the electronics.

Figure 1E:
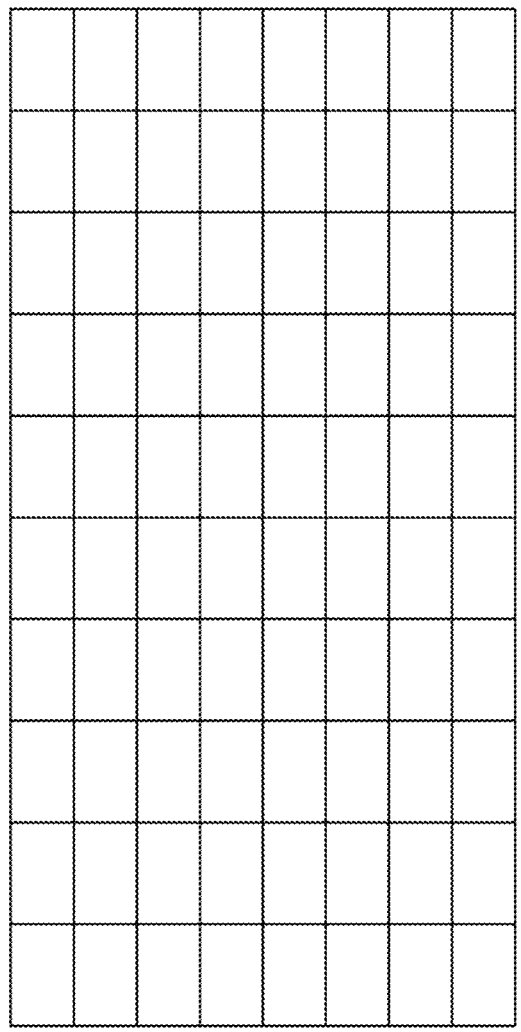
FIG. 1E illustrated one embodiment with a sealed-for-life data center in the form of a grid of data center nodes.

As illustrated in FIG. 1E a sealed-for-life data center node 12 can be in the form of a grid similar to a crate. Data center nodes can be installed in a mechanical grid that provides alignment with the wireless data communications and wireless power transfer subsystems in enclosure 20. The configuration may be likened to a milk bottle crate wherein each data-center node is inserted into a location on the grid. In one embodiment this crate is preferably made of a non-metallic. In one embodiment, there are 1000-100,000 nodes per underwater data center node 12. Crates can be stacked in X, Y and Z axes, and configured to facilitate free movement of and each 'crate' contains a smaller number of data centre nodes 20 as non-limiting examples 16, 25, 100, 225, 1000 to facilitate modularity of construction and maintenance. The crate may be designed to accommodate efficient water cooling. Crates may be located next to each other in a grid or pattern. Crates may be stacked.

Crates may be placed on a base that incorporates one or more of wireless power transfer and wireless communications thereby enabling crates to be removed and replaced without disturbing electrical cabling. Alternatively wireless power and wireless communications may be integrated with each crate and individual data center nodes 12 are replaced.

An optional wireless release mechanism can be provided to facilitate removal/replacement by autonomous vehicle e.g., USV with ROV. In one embodiment, a reverse polarity magnet is used to raise the sphere/cylinder a few cm above the crate, making it easier to recover the individual nodes and/or crates, that can be 16-1000 devices, when they are removed, swapped. In one embodiment, biofouling materials and treatments are used to minimise the build-up of growth and data centre nodes, crates and associated systems are designed to accommodate regular cleaning using as a non-limiting example water jetting to remove biofouling via an autonomous operation. Cleaning is preferably automated using one or more of robotic systems and autonomous vehicles.

Figure 1F:
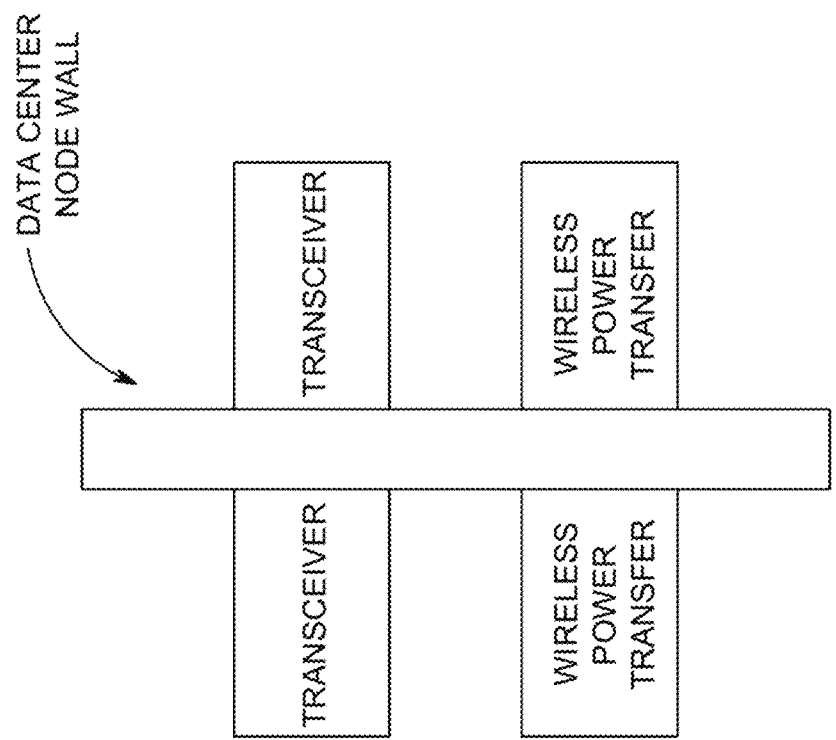
FIG. 1F illustrates one embodiment of a sealed for life data center node that incudes wireless connections for data and power.
Figure 1G:
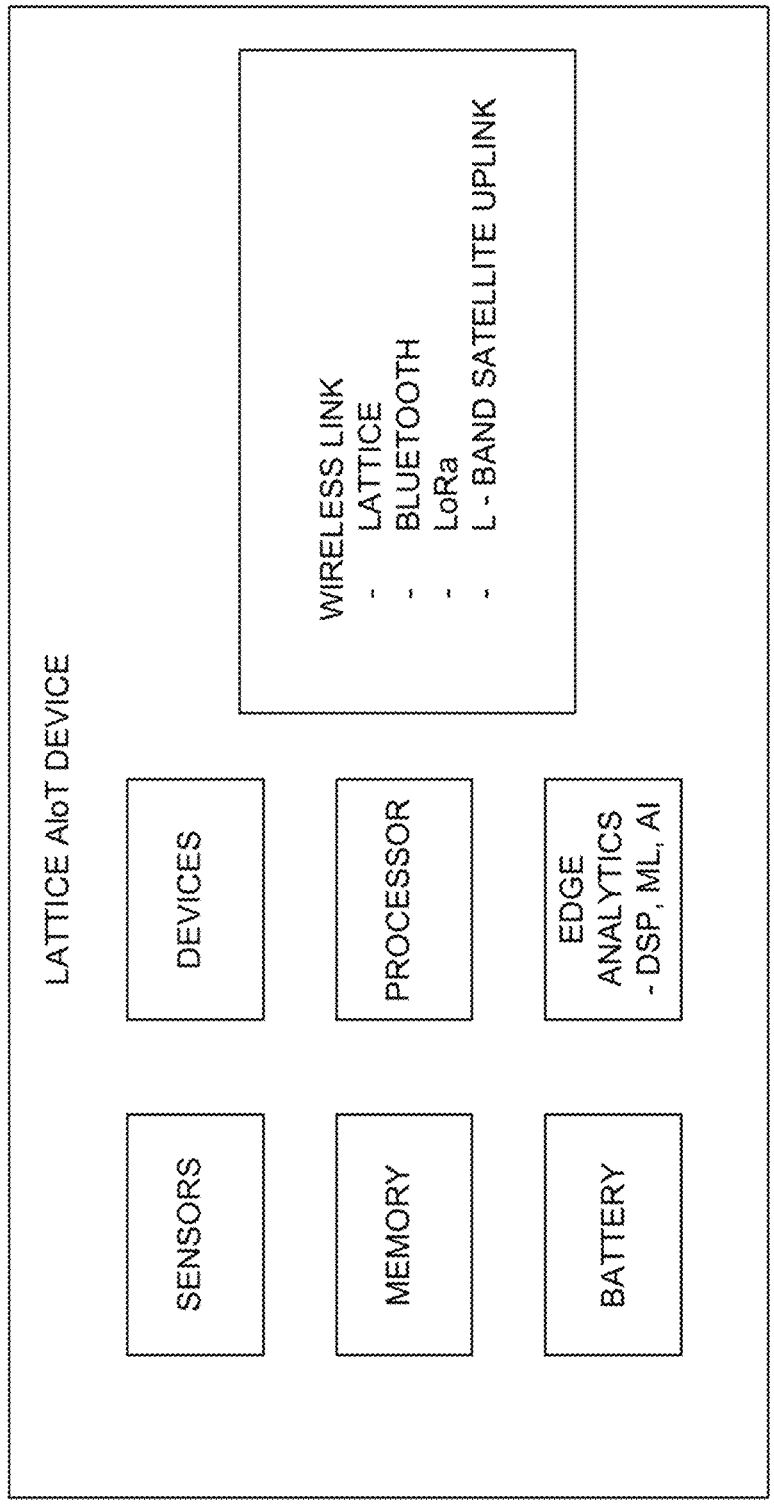
FIG. 1G illustrates one embodiment of a subsea wireless node
Figure 1H:
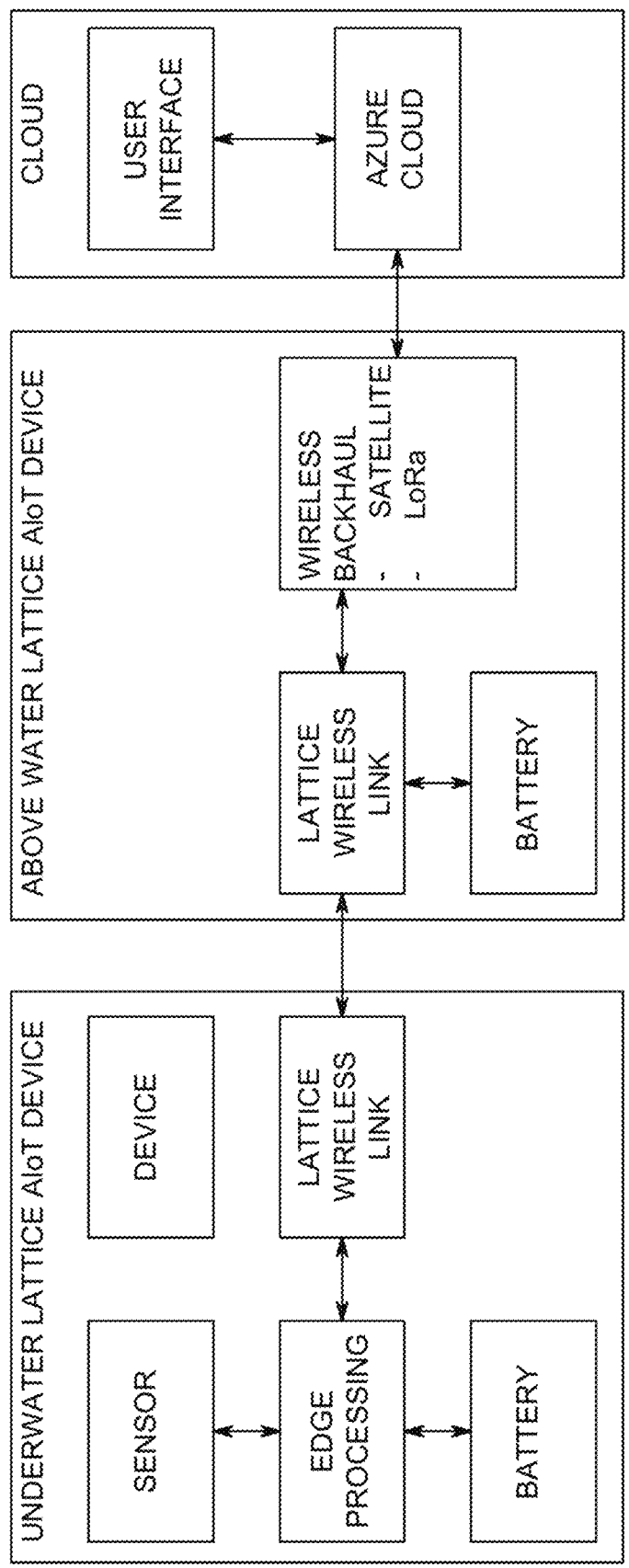
FIG. 1H illustrates one embodiment of an end-to-end IoT cloud service

Referring now to FIG. 1F, a sealed for life data center node 12 incudes wireless connections for data and power. The wireless communications can be of an ultra-high bandwidth, with a short-range radio communication link across a glass face as non-limiting examples E- or V-band microwave at 1 Gbps to 200 Gbps and using alternative methods communication rates of the order 1 Tbps may be achieved. The wireless communication system may optionally incorporate lower bandwidth systems including but not limited to one or more of WiFi, Bluetooth, low frequency radio and LCT. Optionally wireless communications can be provided between data center nodes 12 using a lower carrier frequency EM technology such as but not limited to Bluetooth and WiFi to form an interconnecting wireless network propagating along the non-metallic crate walls. In one embodiment, inductive power transfer is used. The thermal efficiency of wireless power transfer improves where the load is under 500 W but wireless power transfer of 5 kW or more may be achieved. The energy requirement of each data center node 12 is typically 100 W to 2 kW. In one embodiment, an optional single inductive source is provided at a base of each crate or a smaller one under each node.

As non-limiting example, the benefits of a sealed-for-life data center node 12 include but are not limited to: cost, reliability, and carbon footprint.

A subsea data center nodes 12 constructed from many compact, low-cost subsea data center nodes 12 are expensive than single large subsea devices in part because smaller devices afford a greater surface area for cooling and in part because the cost and complexity of subsea enclosures scales disproportionately with size. Glass spheres are cost effective; a sealed-for-life wireless data centre node does not carry the cost of expensive subsea connectors (fibre-optic, electrical) or high tolerance O-rings to manufacture; low-cost datacentre nodes can be designed for autonomous deployment and maintenance For reliability, resilient systems can include an array of identical devices; there can be no penetrations in a subsea enclosure (enclosure 20); there are not wet-mate connectors to fail; O-rings are not needed.

For the carbon footprint, manufacture can include nodes designed for 'lights-out' manufacture; have a much lower labour intensity to manufacture than nodes with penetrating connectors and associated cabling; can be designed for autonomous deployment, recovery using clean energy powered vehicles; and there is a reduced need for manned vessels.

In one embodiment wind farms are used that have fixed bottom turbines extending to 50 m, and the like. In one embodiment the wind turbines extend to 75 m, 80 m, 90 m 100 m and the like. In one embodiment, floating turbines are used that can be deployed in 100-200 m water depths, and the like.

Figure 2:
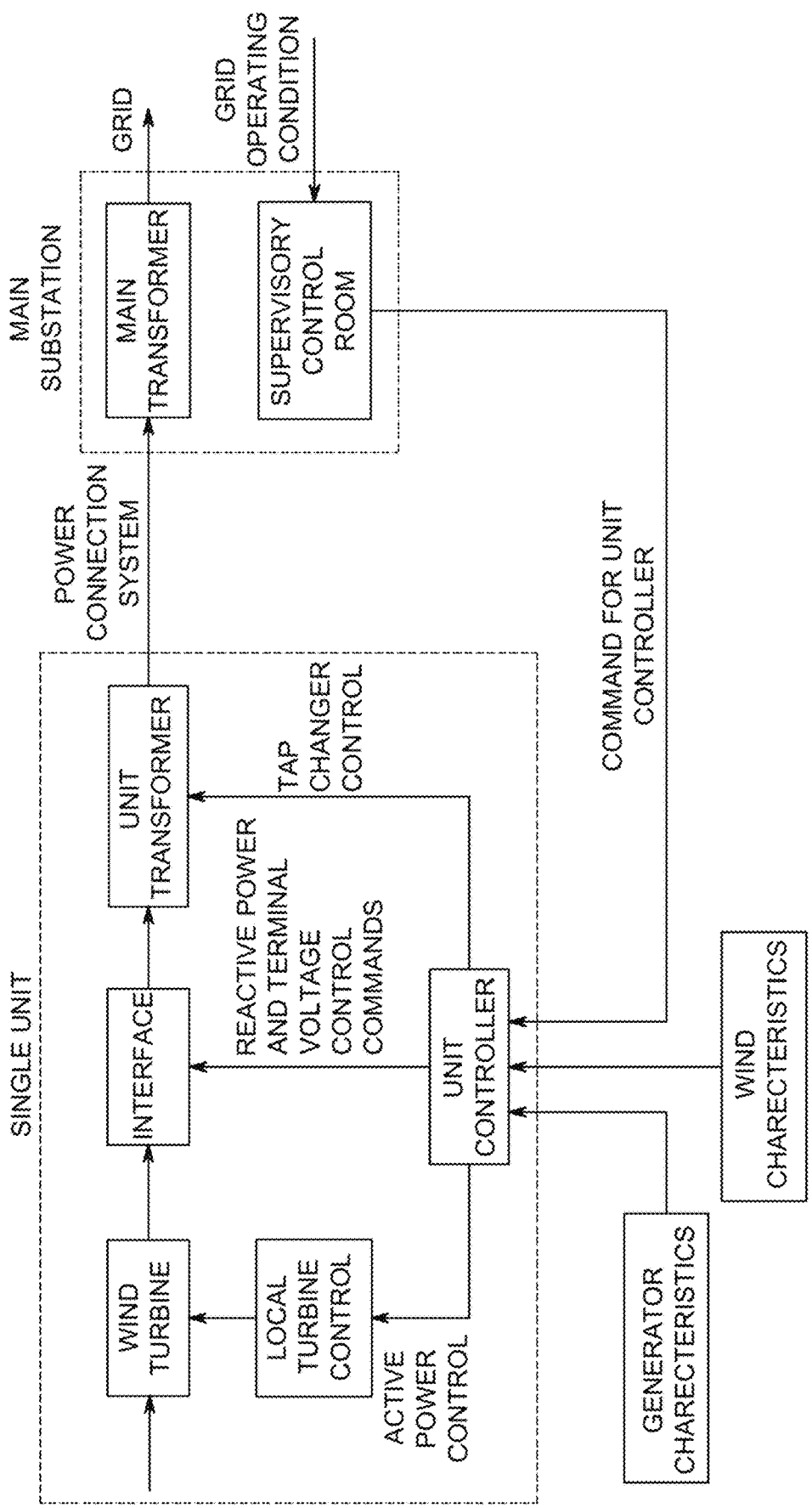
FIG. 2 illustrates one embodiment of an off shore wind power generating system of the present invention.

As illustrated in FIG. 2, and as a non-limiting example, an off shore wind power generating system 31 includes a wind turbine 32 that can include, blades, a wind turbine, wind turbine power and a foundation. The wind turbine 32 uses wind interaction with the blades, and the like. A unit transformer 34 is coupled to the interface 36. A unit controller 38 is coupled to the interface 36 and provides reactive power and terminal voltage control commands. The unit control 40 is coupled to a local turbine control 42 for active power control. Generator characteristics, and wind characteristics are received by the unit controller 40. Commands are sent to the unit controlled 40 by a supervisory control room that received grid operating condition. The unit controller 40 is coupled to a power connection system 42 coupled to a grid 46. A supervisory control room 48 provides commands for the unit controller 40 and receives grid operating conditions.

Figure 3:
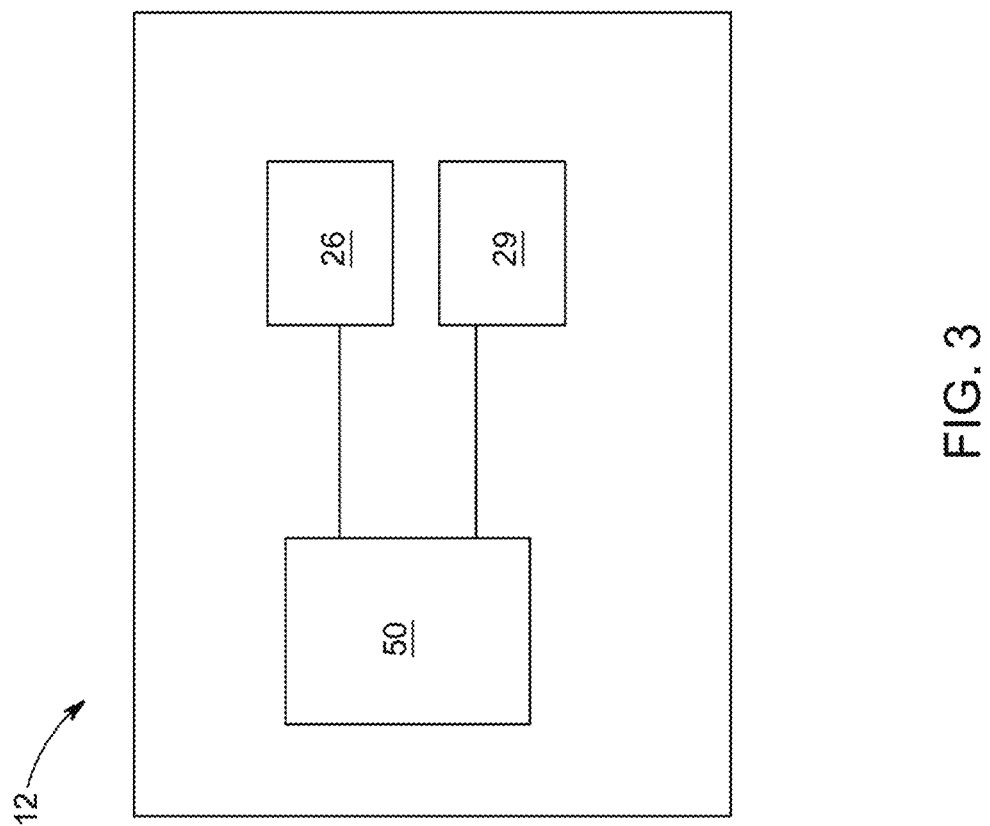
FIG. 3 illustrates one embodiment of an underwater data center 12 installed under the sea and used in an environment in which it is surrounded by sea water.

In one embodiment, illustrated in FIG. 3, underwater data center node 12 is, for example, installed under the sea and used in an environment in which it is surrounded by sea water SW. There is no limitation to the location where the underwater data center node 12 is installed so long as the location is under water, and instead of under the sea, for example, may be in a lake or a pond, or may be in a river.

The underwater data center 12 includes an energy storage device 50. The energy storage device 50 is housed in a housing member 20. The energy storage device 50 includes, for example, a storage device that stores data, a transceiver 52 that exchanges data with an external device, a processing device 54 that performs predetermined processing on data, a controller 56 that controls the exchange of data and so on.

There is no particular limitation to specific examples of the transceiver 52 of the energy storage device 50. For example, in an underwater data center nodes 12 provided with an antenna 26, the transceiver 28 may perform wireless data exchange. In such a case, a reliable exchange of electromagnetic waves is possible if the antenna 58 is disposed above sea level SL. The transceiver 28 may also have a structure that performs wired data exchange using a cable. In an underwater data center node 12 having a structure that performs wired data exchange, a communication cable extends from the energy storage device 50, passes through the housing member 20, and extends to outside the housing member 20.

Grid operators and/or electrical utilities can use a variety of different techniques to handle fluctuating conditions on a given grid, such as spinning reserves and peaking power plants. Despite these mechanisms that grid operators have for dealing with grid fluctuations, grid outages and other problems still occur and can be difficult to predict. Because grid outages are difficult to predict, it is also difficult to take preemptive steps to mitigate problems caused by grid failures. For the purposes of this document, the term "grid failure" or "grid failure event" encompasses complete power outages as well as less severe problems such as brownouts.

Some data center node 12 installations (e.g., s, data center node 12 farms, etc.) use quite a bit of power, and may constitute a relatively high portion of the electrical power provided on a given grid. Because they use substantial amounts of power, these data center node 12 may be connected to high-capacity power distribution lines. This, in turn, means that the data center node 12 can sense grid conditions on the power lines that could be more difficult to detect for other power consumers, such as residential power consumers connected to lower-capacity distribution lines.

In one embodiment, data center nodes 12 may also be connected to very high bandwidth, low latency computer networks, and thus may be able to communicate very quickly. In some cases, grid conditions sensed at one data center node 12 may be used to make a prediction about grid failures at another installation. For example, data center node 12 may be located on different grids that tend to have correlated grid outages. This could be due to various factors, such as weather patterns that tend to move from one data center node 12 to another, due to the underlying grid infrastructure used by the two data center node 12, etc. Even when grid failures are not correlated between different grids, it is still possible to learn from failures on one grid what type of conditions are likely to indicate future problems on another grid.

In one embodiment, data center node 12 also have several characteristics that enable them to benefit from advance notice of a grid failure. For example, data center node 12 may have local power generation capacity that can be used to either provide supplemental power to the grid or to power data center nodes 12 in the data center node 12 rather than drawing that power from the grid. Data center node 12 can turn on or off their local power generation based on how likely a future grid failure is, e.g., turning on or increasing power output of the local power generation when a grid failure is likely.

In one embodiment, data center node 12 can have local energy storage device 50 such as batteries (e.g., located in uninterruptable power supplies). Data center node 12 can selectively charge their local energy storage device 50 under some circumstances, e.g., when a grid failure is predicted to occur soon, so that the data center node 12 can have sufficient stored energy to deal with the grid failure. Likewise, data center node 12 can selectively discharge their local energy storage device 50 under other circumstances, e.g., when the likelihood of a grid failure in the near future is very low.

In one embodiment, data center node 12 can adjust local deferrable workloads based on the likelihood of a grid failure. For example, a data center node 12 can schedule deferrable workloads earlier than normal when a grid failure is predicted to occur. In addition, power states of data server nodes 12 may be adjusted based on the likelihood of a grid failure, e.g., one or more data center nodes may be placed in a low power state (doing less work) when a grid failure is unlikely in the near future and the data center nodes can be transitioned to higher power utilization states when a grid outage is more likely.

In one embodiment, data center node 12 adaptively adjusts some or all of the following based on the predicted likelihood of a grid failure: (1) on-site generation of power, (2) on-site energy storage, and (3) power utilization/workload scheduling by the data center nodes 12. Because of the flexibility to adjust these three parameters, data center node 12 may be able to address predicted grid failure before they actually occur. This can benefit the data center node 12 by ensuring that workloads are scheduled efficiently, reducing the likelihood of missed deadlines, lost data, unresponsive services, and the like.

Figure 4:
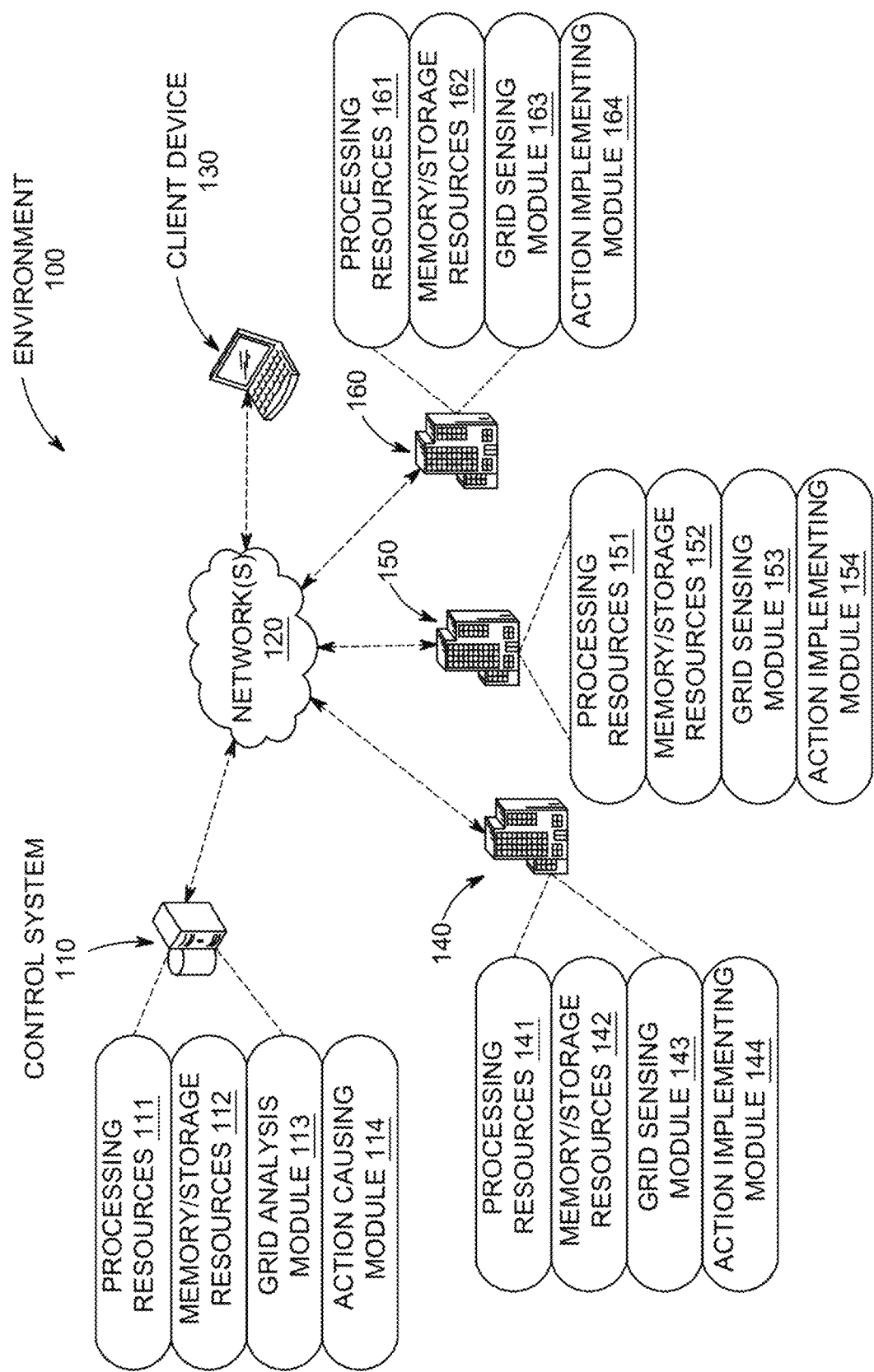
FIG. 4 illustrates one embodiment on an environment consistent with some implementations of the present invention.

In one embodiment, illustrated in FIG. 4, an example environment 100 can include a control system 110 connected via a network 120 to a client device 130 and data centers 150, and 160 (data centers 12) hereafter data center 150. Generally speaking, the client device 130 may request various services from any of the data centers 150, which in turn use electrical power to perform computational work on behalf of the client device 130. The data centers may be connected to different grids that suffer different grid failures at different times. The control system 110 can receive various grid condition signals from the data centers and control the data centers based on the predicted likelihood of grid outages at the respective grids, as discussed more below. Because the data centers and control system 110 may be able to communicate very quickly over network 120, the data centers may be able to react quickly in response to predicted grid outages.

In one embodiment, the control system 110 may include a grid analysis module 113 that is configured to receive data, such as grid condition signals, from various sources such as data centers 150, and 160 (12). The grid analysis module can analyze the data to predict grid outages or other problems. The control system 110 may also include an action causing module 114 that is configured to use the predictions from the grid analysis module to determine different power hardware and data center node 12 actions for the individual data centers to apply. The action causing module may also be configured to transmit various instructions to the individual data centers to cause the data centers to perform these power hardware actions and/or data center node 12 actions.

In one embodiment, the data centers can include respective grid sensing modules 143, 153, and/or 163. Generally, the grid sensing modules can sense various grid condition signals such as voltage, power factor, frequency, electrical outages or other grid failures, etc. These signals can be provided to the grid analysis module 113 for analysis. In some cases, the grid sensing module can perform some transformations on the grid condition signals, e.g., using analog instrumentation to sense the signals and transforming the signals into a digital representation that is sent to the grid analysis module. For example, integrated circuits can be used to sense voltage, frequency, and/or power and digitize the sensed values for analysis by the grid analysis module.

In one embodiment, using the grid condition signals received from the various data centers, the grid analysis module 113 can perform grid analysis functionality such as predicting future power outages or other problems on a given grid. In some cases, the grid analysis module identifies correlations of grid outages between different data centers located on different grids. In other implementations, the grid analysis module identifies certain conditions that occur with grid outages detected by various data centers and predicts whether other grid outages will occur on other grids based on existence of these conditions at the other grids.

In one embodiment, action causing module 114 can use a given prediction to control the energy hardware at any of the data centers. Generally, the action causing module can send instructions over network 120 to a given data center. Each data center can have a respective action implementing module 144, 154, and 164 that directly controls the local energy hardware and/or data center nodes 12 in that data center based on the received instructions. For example, the action causing module may send instructions that cause any of the action implementing modules to use locally-sourced power from local energy storage devices 50, generators, or other energy sources instead of obtaining power from a power generation facility or grid. Likewise, the action causing module can provide instructions for controlling one or more switches at a data center to cause power to flow to/from the data center to an electrical grid. In addition, the action causing module can send instructions that cause the action implementing modules at any of the data centers to throttle data processing for certain periods of time in order to reduce total power consumption (e.g., by placing one or more data center nodes 12 in a low power consumption state).

In one embodiment, the action causing module can perform an analysis of generator state and energy storage state at a given data center. Based on the analysis as well as the prediction obtained from the grid analysis module 113, the control system 110 can determine various energy hardware actions or data center node 12 actions to apply at the data center. These actions can, in turn, cause data center nodes 12 at the data center to adjust workloads as well as cause the generator state and/or energy storage state to change.

In one embodiment, control system 110 may be collocated with any or all of the data centers. For example, in some cases, each data center may have an instance of the entire control system 110 located therein and the local instance of the control system 110 may control power usage/generation and data center nodes 12 at the corresponding data centers. In other cases, each data center may be controlled over network 120 by a single instance of the control system 110. In still further cases, the grid analysis module 113 is located remotely from the data centers and each data center can have its own action causing module located thereon. In this case, the grid analysis module provides predictions to the individual data centers, the action causing module evaluates local energy hardware state and/or data center node 12 state, and determines which actions to apply based on the received predictions.

In one embodiment, control system 110 can include various processing resources 111 and memory/storage resources 112 that can be used to implement grid analysis module 113 and action causing module 114. Likewise, the data centers can include various processing resources 141, 151, and 161 and memory/storage resources 142, 152, and 162. These processing/memory resources can be used to implement the respective grid sensing modules 143, 153, and 163 and the action implementing modules 144, 154, and 164.

In one embodiment, data centers may be implemented in both supply-side and consumption-side scenarios. Generally speaking, a data center in a supply-side scenario can be configured to provide electrical power to the grid under some circumstances and to draw power from the grid in other circumstances. A data center in a consumption-side scenario can be configured to draw power from the grid but may not be able to provide net power to the grid. For the purposes of example, assume data center 150 is configured in a supply-side scenario and data centers 150 and 160 are configured in consumption-side scenarios, as discussed more below.

Figure 5:
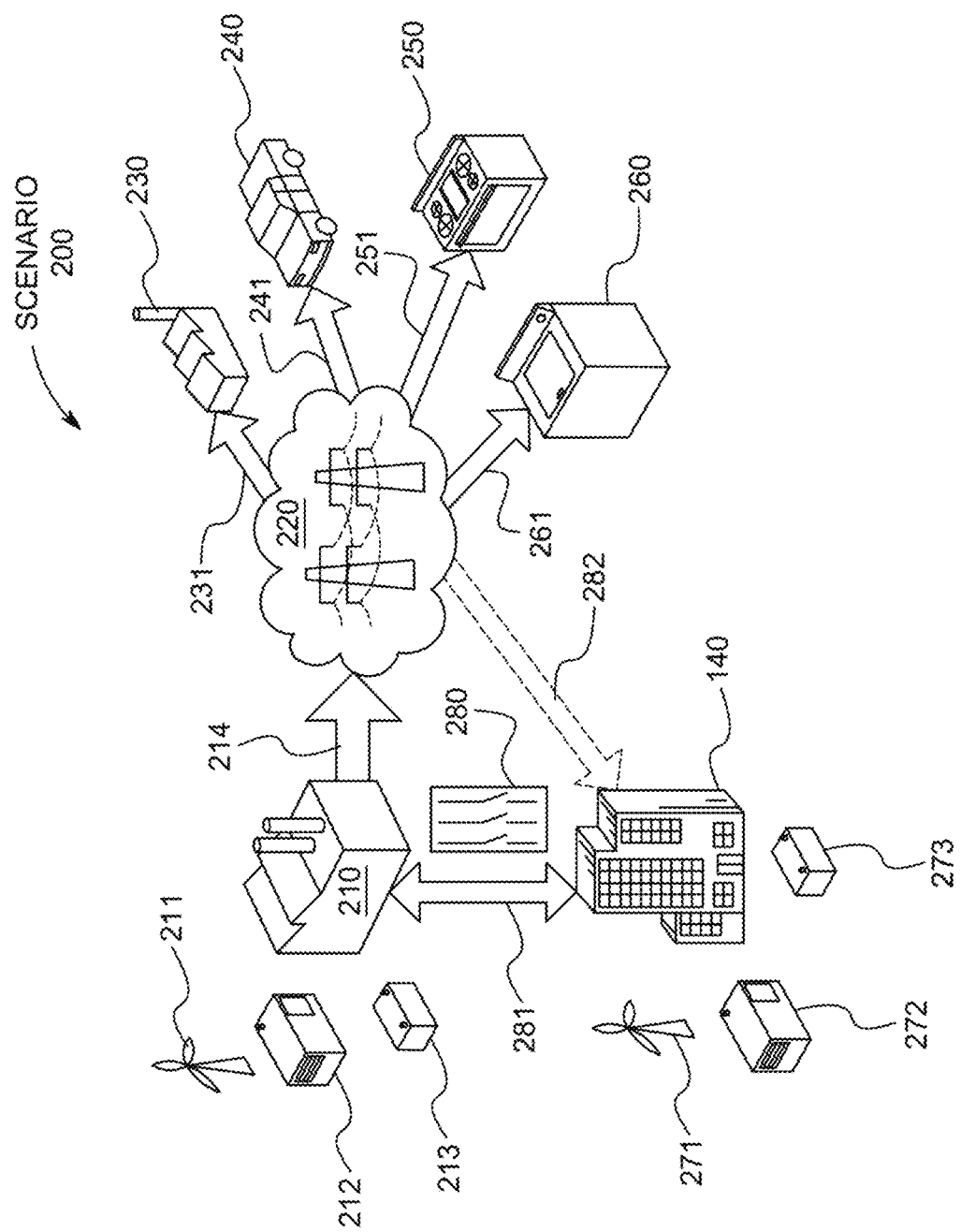
FIGS. 5 and 6 illustrate different scenarios on various embodiments of the present invention.

In one embodiment, illustrated in FIG. 5, a power generation facility 210 provides electrical power to an electrical grid 220 having electrical consumers 230-260. In the example of FIG. 5, the electrical consumers are shown as a factory 230, electric car 0, electric range 250, and washing machine 260, but those skilled in the art will recognize that any number of different electrically-powered devices may be connected to grid 220. Generally speaking, the power generation facility provides power to the grid and the electrical consumers consume the power, as illustrated by the directionality of arrows 214, 231, 241, 251, and 261, respectively. Note that, in some cases, different entities may manage the power generation facility and the grid (e.g., a power generation facility operator and a grid operator) and in other cases the same entity will manage both the power generation facility and the grid.

In one embodiment, data center 150 is coupled to the power generation facility 210 via a switch 280. Switch 280 may allow power to be sent from the power generation facility to the data center or from the data center to the power generation facility as shown by bi-directional arrow 281. In some cases, the switch can be an automatic or manual transfer switch. Note that in this example, the power generation facility is shown with corresponding energy sources 211-213, which include renewable energy generators 211 (e.g., wind, solar, hydroelectric), fossil fuel generators 212, and energy storage device. In one embodiment, the power generation facility may have one or more main generators as well as other generators for reserve capacity, as discussed more below.

In one embodiment, the data center 150 may be able to draw power directly from electrical grid 220 as shown by arrow 282. This can allow the data center 150 to sense conditions on the electrical grid. These conditions can be used to predict various grid failure events on electrical grid 220, as discussed more herein.

In one embodiment, the data center 150 may have multiple data center node 12 racks powered by corresponding power supplies. The power supplies may rectify current provided to the data center node 12 power supplies from alternating current to direct current. In addition, the data center may have appropriate internal transformers to reduce voltage produced by the data center or received from the power generation facility 210 to a level of voltage that is appropriate for the data center node 12 power supplies. In further implementations discussed more below, the data center node 12 power supplies may have adjustable impedance so they can be configured to intentionally draw more/less power from the power generation facility.

In one embodiment, the switch 280 can be an open transition switch and in other cases can be a closed transition switch. In the open transition case, the switch is opened before power generation at the data center 150 is connected to the grid 220. This can protect the grid from potential problems caused by being connected to the generators. Generally, a grid operator endeavors to maintain the electrical state of the grid within a specified set of parameters, e.g., within a given voltage range, frequency range, and/or power factor range. By opening the switch before turning on the generators, the data center 150 can avoid inadvertently causing the electrical state of the grid to fluctuate outside of these specified parameters.

In one embodiment, the open transition scenario does not connect running generators to the grid 220, this scenario can prevent the data center 150 from providing net power to the grid. Nevertheless, the data center can still adjust its load on the grid using the switch 280. For example, switch 180 can include multiple individual switches and each individual switch can be selectively opened/closed so that the grid sees a specified electrical load from the data center. Generators connected to the closed switches may generally be turned off or otherwise configured not to provide power to the grid, whereas generators connected to the open switches can be used to provide power internally to the data center or, if not needed, can be turned off or idled. Likewise, data center nodes 12 can be configured into various power consumption states and/or energy storage device 213s can be charged or discharged to manipulate the electrical load placed on the grid by the data center.

In one embodiment, the generators can be connected to the grid 220 when generating power. As a consequence, either net power can flow from the grid to the data center 150 (as in the open transition case) or net power can flow from the data center to the grid. However, particularly in the closed transition case, the data center can inadvertently cause the grid to fluctuate outside of the specified voltage, frequency, and/or power factor parameters mentioned above. Thus, in some cases, the generators can be turned on and the sine waves of power synchronized with the grid before the switch is closed, e.g., using paralleling switchgear to align the phases of the generated power with the grid power. If needed, the local energy storage of the data center can be utilized to provide power to the local data center nodes 12 during the time the generators are being synchronized with the grid. Note that closed transition implementations may also use multiple switches, where each switch may have a given rated capacity and the number of switches turned on or off can be a function of the amount of net power being drawn from the grid or the amount of net power being provided to the grid.

In one embodiment, the amount of net power that can be provided to the grid 220 at any given time is a function of the peak power output of the generators (including possibly running them in short-term overload conditions for a fixed number of hours per year) as well as power from energy storage (e.g., discharging batteries). For example, if the generators are capable of generating 100 megawatts and the energy storage device 213 are capable of providing 120 megawatts (e.g., for a total of 90 seconds at peak discharge rate), then a total of 220 megawatts can be sent to the grid for 90 seconds and thereafter 100 megawatts can still be sent to the grid. In addition, generation and/or energy storage capacity can be split between the grid and the data center nodes 12, e.g., 70 megawatts to the data center nodes 12 and 150 megawatts to the grid for up to 90 seconds and then 30 megawatts to the grid thereafter, etc.

In one embodiment, the amount of capacity that can be given back to the grid 220 is a function of the amount of power being drawn by the data center nodes 12. For example, if the data center nodes 12 are only drawing 10 megawatts but the data center 150 has the aforementioned 100-megawatt generation capacity and 120 megawatts of power from energy storage, the data center can only "give back" 10 megawatts of power to the grid because the data center nodes 12 are only drawing 10 megawatts. Thus, the ability of the data center to help mitigate problems in the grid can be viewed as partly a function of data center node 12 load.

In one embodiment, energy storage device 213 can be selectively charged to create a targeted load on the grid 220. In other words, if the batteries can draw 30 megawatts of power when charging, then in either case an additional 30 megawatts can be drawn from the grid so long as the energy storage device 213 are not fully charged. In some cases, the amount of power drawn by the batteries when charging may vary with the charge state of the energy storage device 213, e.g., they may draw 30 megawatts when almost fully discharged (e.g., 10% charged) and may draw only 10 megawatts when almost fully charged (e.g., 90% charged).

Figure 6:
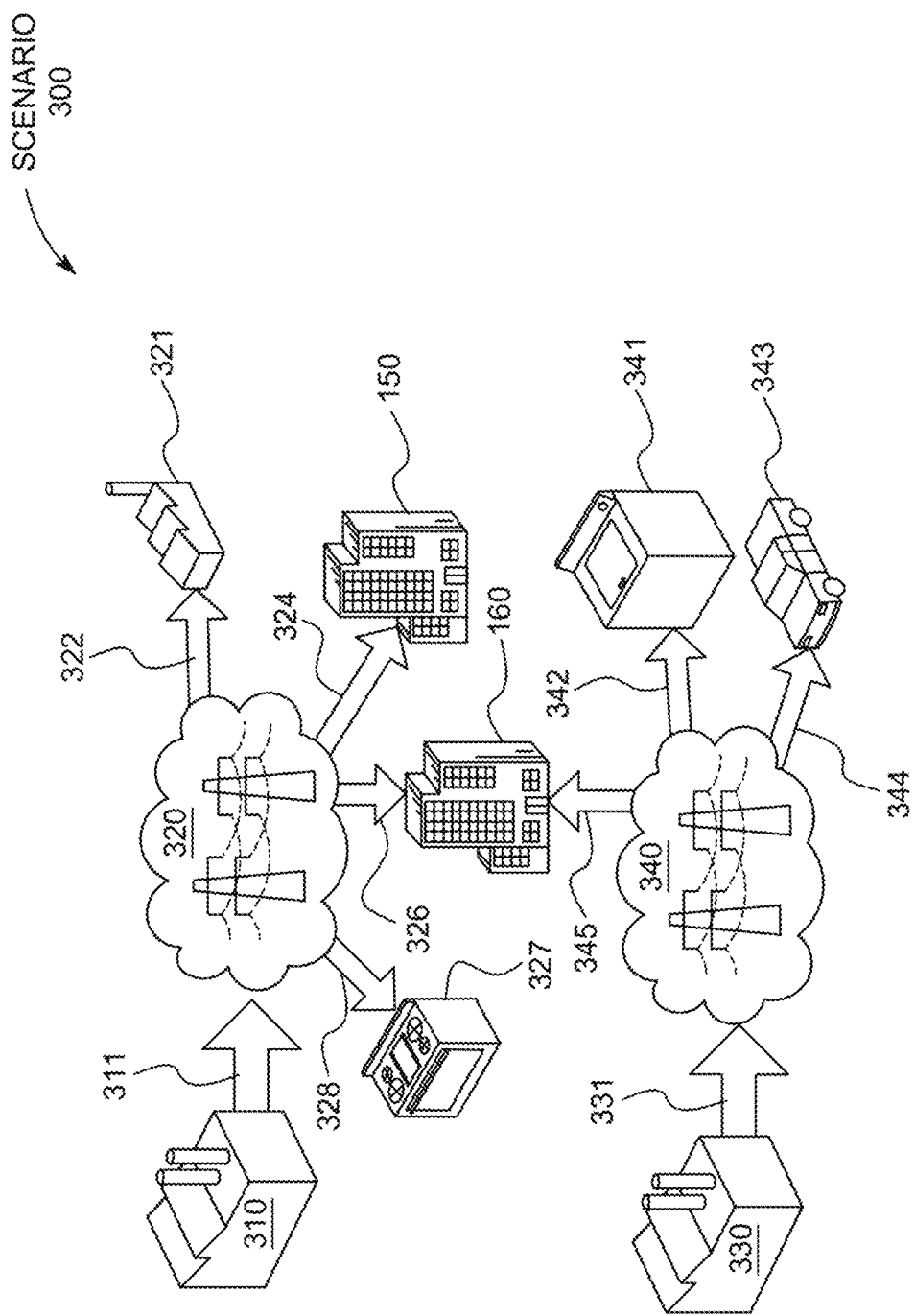

In one embodiment, data centers 150 and 160 can be configured in a consumption-side scenario. FIG. 6 illustrates an example scenario 300 with a power generation facility 310 providing electrical power to an electrical grid 320 as shown at arrow 311. In this example, electrical grid 320 provides power to various consumers as shown by arrows 322, 324, 326, and 328. In this example, the consumers include factory 321 and electric range 327, and also data centers 150 and 160. In some cases, the data centers 150 and 160 may lack a closed-transition switch or other mechanism for sending power back to the power generation facility 310. Nevertheless, as discussed more below, power consumption by data centers 150 and 160 may be manipulated and, in some cases, this may provide benefits to an operator of power generation facility 310 and/or electrical grid 320.

In one embodiment, power generation facility 330 provides electrical power to another electrical grid 340 as shown at arrow 331. In this example, electrical grid 340 provides power to consumers 341 and 343 (illustrated as a washing machine and electric car) as shown by arrows 342 and 344. Note that in this example, data center 160 is also connected to electrical grid 340 as shown at arrow 345. Thus, data center 160 can selectively draw power from either electrical grid 320 or electrical grid 340.

In one embodiment, data centers 150 and 160 may have similar energy sources such as those discussed above with respect to data center 150. In certain examples discussed below, data center 150 can selectively use power from electrical grid 320 and local batteries and/or generators at data center 150. Likewise, data center 160 can selectively use power from electrical grid 320, electrical grid 340, and local batteries and/or generators at data center 160. In some cases, data center 150 and/or 160 may operate for periods of time entirely based on local energy sources without receiving power from electrical grids 320 and 340.

In one embodiment, a given data center can sense conditions on any electrical grid to which it is connected. Thus, in the example of FIG. 7, data center 150 can sense grid conditions on electrical grid 320, and data center 160 can sense grid conditions on both electrical grid 320 and electrical grid 340. Likewise, referring back to FIG. 6 data center 150 can sense grid conditions on electrical grid 220. As discussed further herein, failures occurring on electrical grids 220, 320 and/or 340 can be used to predict future failures on electrical grids 220, 320, electrical grid 340, and/or other electrical grids.

As a non-limiting example, the term "electrical grid" refers to an organizational unit of energy hardware that delivers energy to consumers within a given region. In some cases, the region covered by an electrical can be an entire country, such as the National Grid in Great Britain. Indeed, even larger regions can be considered a single grid, e.g., the proposed European super grid that would cover many different European countries. Another example of a relatively large-scale grid is various interconnections in the United States, e.g., the Western Interconnection, Eastern Interconnection, Alaska Interconnection, Texas Interconnection, etc.

In one embodiment, within a given grid there can exist many smaller organizational units that can also be considered as grids. For example, local utilities within a given U.S. interconnection may be responsible for maintaining/operating individual regional grids located therein. The individual regional grids within a given interconnection can be electrically connected and collectively operate at a specific alternating current frequency. Within a given regional grid there can exist even smaller grids such as "microgrids" that may provide power to individual neighborhoods.

Figure 7:
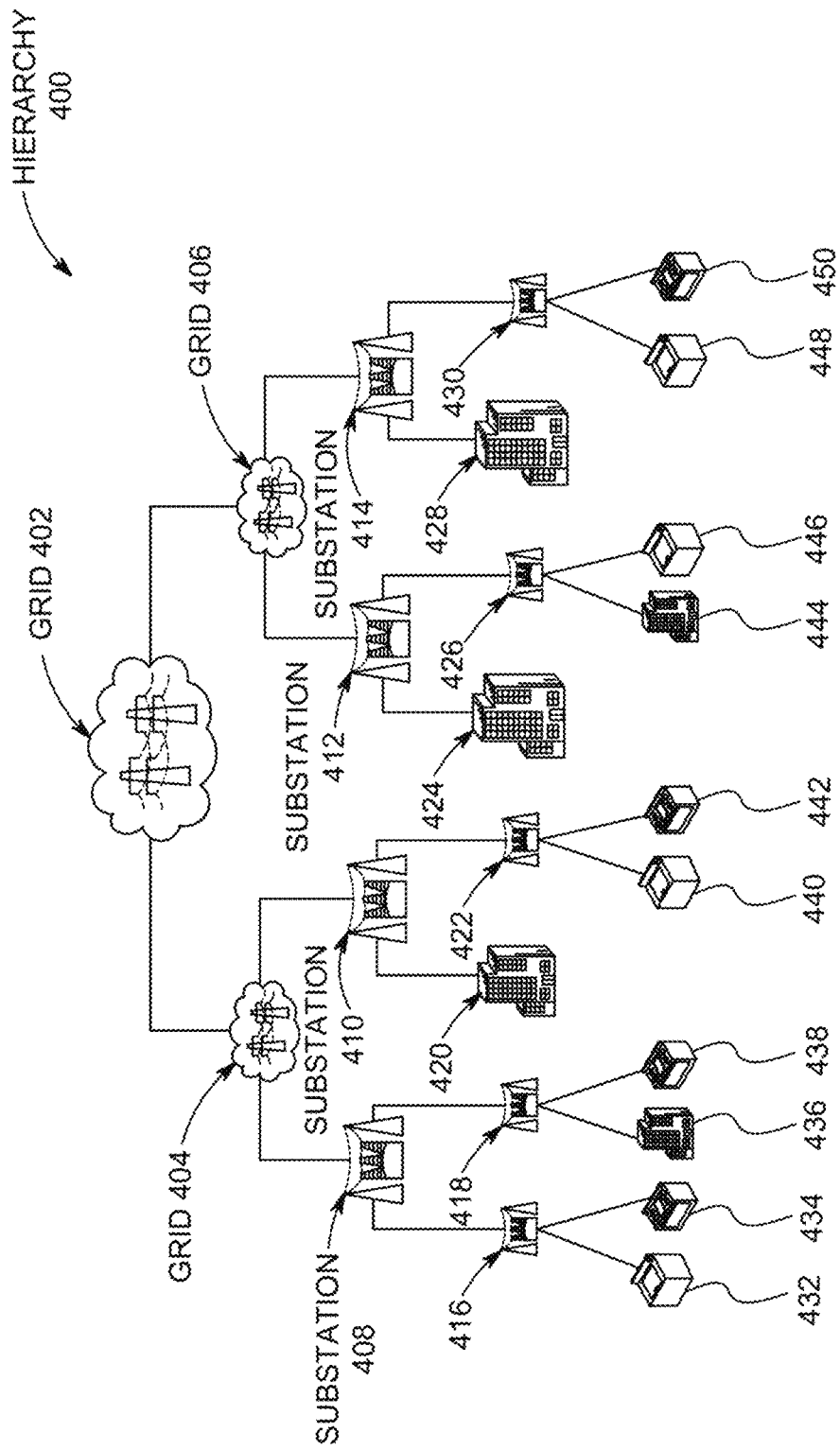
FIG. 7 illustrates an example hierarchy in one embodiment of the present invention.

In one embodiment, illustrated in FIG. 7, an example electrical grid hierarchy 400 is consistent with certain implementations. As a non-limiting example, FIG. 7 is shown for the purposes of illustration and that actual electrical grids are likely to exhibit significantly more complicated relationships than those shown in FIG. 7.

In one embodiment, illustrated in FIG. 4, electrical grid hierarchy 400 can be viewed as a series of layers, with a top layer having a grid 402. Grid 402 can include other, smaller grids such as grids 404 and 406 in a next-lower layer. Grids 404 and 406 can, in turn, include substations such as substation 408, 410, 412, and 414 in a next-lower layer. Each of substations 408, 410, 412, and 414 can include other substations 416, 418, 422, 426, and 430 and/or data centers 420, 424, and 428 in a next-lower layer. Substations 416, 418, 422, 426, and 430 can include various electrical consumers in the lowest layer, which shows electrical consumers 432, 434, 436, 438, 440, 442, 444, 446, 448, and 450.

In one embodiment, the electrical consumers shown in FIG. 7 include data centers 420, 424, 428, 436, and 444. Generally, these data centers can be configured as discussed above with respect to FIGS. 1-3 for any of data centers 12, 150, and/or 160. Moreover, grids 402, 404, and 406 can be similar to grids 220, 320, and/or 340. More generally, the disclosed implementations can be applied for many different configurations of data centers and electrical grids.

In one embodiment, within the hierarchy 400, substations at a higher level can be distribution substations that operate at a relatively higher voltage than other distribution substations at a lower level of the hierarchy. Each substation in a given path in the hierarchy can drop the voltage provided to it by the next higher-level substation. Thus, data centers 420, 424, and 428 can be connected to higher-voltage substations 410, 412, and 414, respectively, whereas data centers 436 and 444 are connected to lower-voltage substations 418 and 426. Regardless of which substation a given data center is connected to, it can sense power quality on the power lines to the data center. However, a data center connected to a higher-voltage substation may be able to sense grid conditions more accurately and/or more quickly than a data center connected to a lower-voltage substation.

In one embodiment, a relationship between two data centers can be determined using electrical grid hierarchy 400, e.g., by searching for a common ancestor in the hierarchy. For example, data centers 436 and 444 have a relatively distant relationship, as they share only higher-level grid 402. In contrast, data centers 424 and 444 are both served by substation 412 as a common ancestor. Thus, a grid failure event occurring at data center 444 may be more likely to imply a grid failure event at data center 424 than would be implied by a grid failure event at data center 436. More generally, each grid or substation in the hierarchy may provide some degree of electrical isolation between those consumers directly connected to that grid or substation and other consumers.

In one embodiment, while the electrical grid hierarchy 400 shows an electrical relationship between the elements shown in FIG. 7, these electrical relationships can also correspond to geographical relationships. For example, grids 404 and 406 could be regional grids for two different regions and grid 402 could be an interconnect grid that includes both of these regions. As another example, grids 404 and 406 could be microgrids serving two different neighborhoods and grid 402 could be a regional grid that serves a region that includes both of these neighborhoods. More generally, grids shown at the same level of the grid hierarchy will typically be geographically remote, although there may be some overlapping areas of coverage. Further, individual data centers may have different relative sizes, e.g., data centers 436 and 444 can be smaller than data centers 420, 424, and 428.

In one embodiment, a given data center can sense its own operation conditions, such as workloads, battery charge levels, and generator conditions, as well as predict its own computational and electrical loads as well as energy production in the future. By integrating into the grid, data centers can observe other conditions of the grid, such as the voltage, frequency, and power factor changes on electrical lines connecting the data center to the grid. In addition, data centers are often connected to fast networks, e.g., to client devices, other data centers, and to management tools such as control system 110. In some implementations, the control system 110 can coordinate observations for data centers at vastly different locations. This can allow the data centers to be used to generate a global view of grid operation conditions, including predicting when and where future grid failure events are likely to occur.

Figure 8:
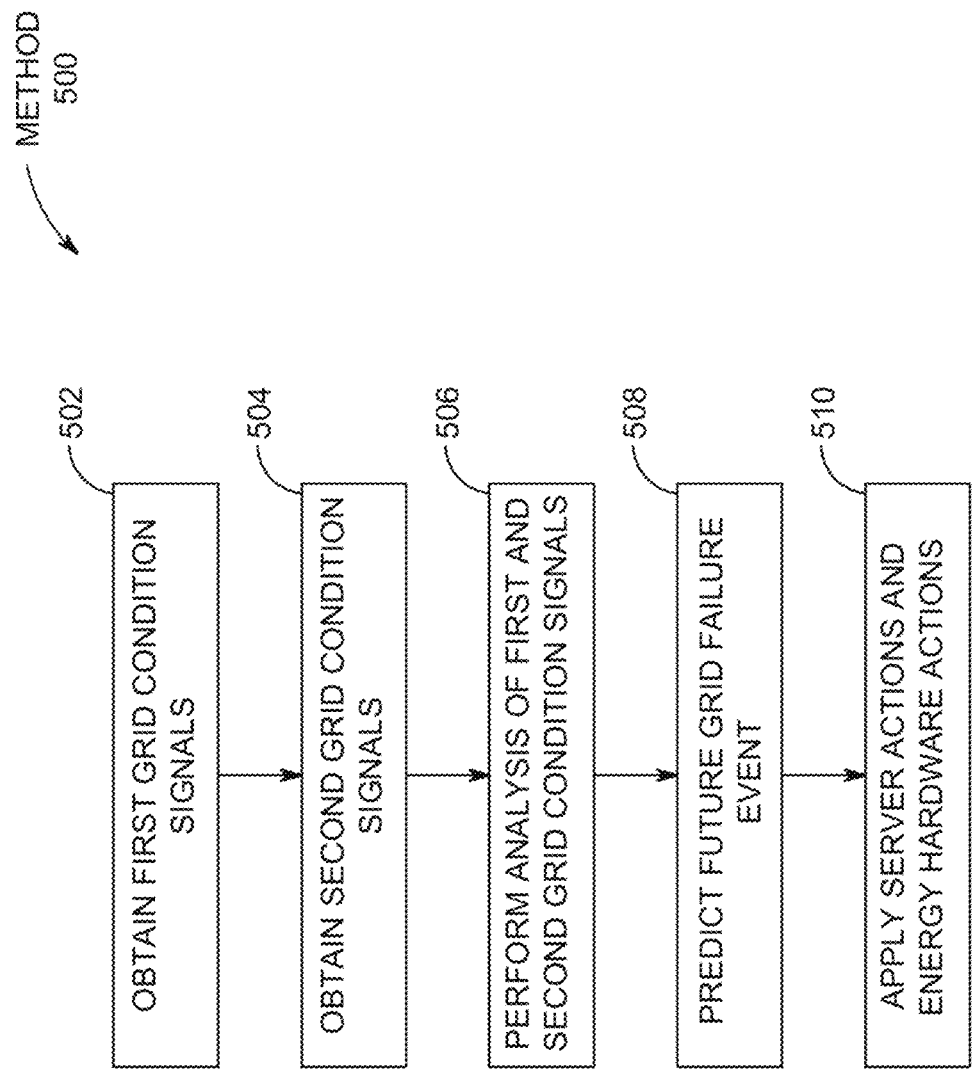
FIG. 8 illustrates one embodiment of a method or technique of the present invention.

In one embodiment, illustrated in FIG. 8 a method 500 is provided that can be performed by control system 110 or another system.

In one embodiment, block 502 of method 500 can include obtaining first grid condition signals. For example, a first data center node 12 facility connected to a first electrical grid may obtain various grid condition signals by sensing conditions on the first electrical grid. The first grid condition signals can represent many different conditions that can be sensed directly on electrical lines at the first data centers, such as the voltage, frequency, power factor, and/or grid failures on the first electrical grid. In addition, the first grid condition signals can include other information such as the current price of electricity or other indicators of supply and/or demand on the first electrical grid. The first grid condition signals can represent conditions during one or more first time periods, and one or more grid failure events may have occurred on the first electrical grid during the one or more first time periods.

In one embodiment, block 504 can include obtaining second grid condition signals. For example, a second data center node 12 facility connected to a second electrical grid may obtain various grid condition signals by sensing conditions on the second electrical grid. The second electrical grid can be located in a different geographic area than the first electrical grid. In some cases, both the first electrical grid and the second electrical grid are part of a larger grid. Note the second grid condition signals can represent similar conditions to those discussed above with respect to the first electrical grid and can represent conditions during one or more second time periods when one or more grid failure events occurred on the second electrical grid. Note that both the first grid condition signals and second grid condition signals can also cover times when no grid failures occurred. Also note that the first and second time periods can be the same time periods or different time periods.

In one embodiment, block 506 can include performing an analysis of the first grid condition signals and the second grid condition signals. For example, in some cases, the analysis identifies correlations between grid failure events on the first electrical grid and grid failure events on the second electrical grid. In other cases, the analysis identifies conditions on the first and second electrical grids that tend to lead to grid failure events, without necessarily identifying specific correlations between failure events on specific grids.

In one embodiment, block 508 can include predicting a future grid failure event. For example, block 508 can predict that a future grid failure event is likely to occur on the first electrical grid, the second electrical grid, or another electrical grid. In some cases, current or recent grid condition signals are obtained for many different grids and certain grids can be identified as being at high risk for grid failure events in the near future.

In one embodiment, block 510 can include applying data center node 12 actions and/or applying energy hardware actions based on the predicted future grid failure events. For example, data centers located on grids likely to experience a failure in the near future can be instructed to turn on local generators, begin charging local batteries, schedule deferrable workloads as soon as possible, send workloads to other data centers (e.g., not located on grids likely to experience near-term failures), etc.

In one embodiment, grid condition signals can be used for the analysis performed at block 506 of method 500. Different grid conditions can suggest that grid failure events are likely. For example, the price of electricity is influenced by supply and demand and thus a high price can indicate that the grid is strained and likely to suffer a failure event. Both short-term prices (e.g., real-time) and longer-term prices (e.g., day-ahead) for power can be used as grid condition signals consistent with the disclosed implementations.

In one embodiment, other grid condition signals can be sensed directly on electrical lines at the data center. For example, voltage may tend to decrease on a given grid as demand begins to exceed supply on that grid. Thus, decreased voltage can be one indicium that a failure is likely to occur. The frequency of alternating current on the grid can also help indicate whether a failure event is likely to occur, e.g., the frequency may tend to fall or rise in anticipation of a failure. As another example, power factor can tend to change (become relatively more leading or lagging) in anticipation of a grid failure event. For the purposes of this document, the term "power quality signal" implies any grid condition signal that can be sensed by directly connecting to an electrical line on a grid, and includes voltage signals, frequency signals, and power factor signals.

In one embodiment, over any given interval of time, power quality signals sensed on electrical lines can tend to change. For example, voltage tends to decrease in the presence of a large load on the grid until corrected by the grid operator. As another example, one or more large breakers being tripped could cause voltage to increase until compensatory steps are taken by the grid operator. These fluctuations, taken in isolation, may not imply failures are likely to occur because grid operators do have mechanisms for correcting power quality on the grid. However, if a data center senses quite a bit of variance in one or more power quality signals over a short period of time, this can imply that the grid operator's compensatory mechanisms are stressed and that a grid failure is likely.

In one embodiment, the signals analyzed at block 506 can also include signals other than grid condition signals. For example, some implementations may consider weather signals at a given data center. For example, current or anticipated weather conditions may suggest that a failure event is likely, e.g., thunderstorms, high winds, cloud cover that may impede photovoltaic power generation, etc. Moreover, weather signals may be considered not just in isolation, but also in conjunction with the other signals discussed herein. For example, high winds in a given area may suggest that some local outages are likely, but if the grid is also experiencing low voltage, then this may suggest the grid is stressed and a more serious failure event is likely.

In one embodiment, the signals analyzed at block 506 can also include data center node 12 condition signals. For example, current or anticipated data center node 12 workloads can, in some cases, indicate that a grid failure may be likely to occur. For example, a data center may provide a search engine service and the search engine service may detect an unusually high number of weather-related searches in a given area. This can suggest that grid failures in that specific area are likely.

As noted above, the control system 110 can cause a data center node 12 facility to take various actions based on predicted grid failure events. These actions include controlling local power generation at a data center, controlling local energy storage at the data center, controlling data center node 12 workloads at the data center, and/or controlling data center node 12 power states at the data center. These actions can alter the state of various devices in the data center, as discussed more below.

In one embodiment, certain actions can alter the generator state at the data center. For example, as mentioned above, the generator state can indicate whether or not the generators are currently running at the data center (e.g., fossil fuel generators that are warmed up and currently providing power). The generator state can also indicate a percentage of rated capacity that the generators are running at, e.g., 50 megawatts out of a rated capacity of 100 megawatts, etc. Thus, altering the generator state can include turning on/off a given generator or adjusting the power output of a running generator.

In one embodiment, other actions can alter the energy storage state at the data center. For example, the energy storage state can indicate a level of discharge of energy storage device 213 in the data center. The energy storage state can also include information such as the age of the energy storage device 213, number and depth of previous discharge cycles, etc. Thus, altering the energy storage state can include causing the energy storage device 213 to begin charging, stop charging, changing the rate at which the energy storage device 213 are being charged or discharged, etc.

In one embodiment, other actions can alter data center node 12 state. The data center node 12 state can include specific power consumption states that may be configurable in the data center node 12, e.g., high power consumption, low power consumption, idle, sleep, powered off, etc. The state can also include jobs that are running or scheduled to run on a given data center node 12. Thus, altering the data center node 12 state can include both changing the power consumption state and scheduling jobs at different times or on different data center nodes 12, including sending jobs to other data centers.

In one embodiment, method 500 can selectively discharge energy storage device 213, selectively turn on/off generators, adaptively adjust workloads performed by one or more data center nodes 12 in the data center, etc., based on a prediction of a grid failure event. By anticipating possible grid failures, the data center can realize various benefits such as preventing jobs from being delayed due to grid failure events, preventing data loss, etc. In addition, grid operators may benefit as well because the various actions taken by the server may help prevent grid outages, provide power factor correction, etc.

Figure 9:
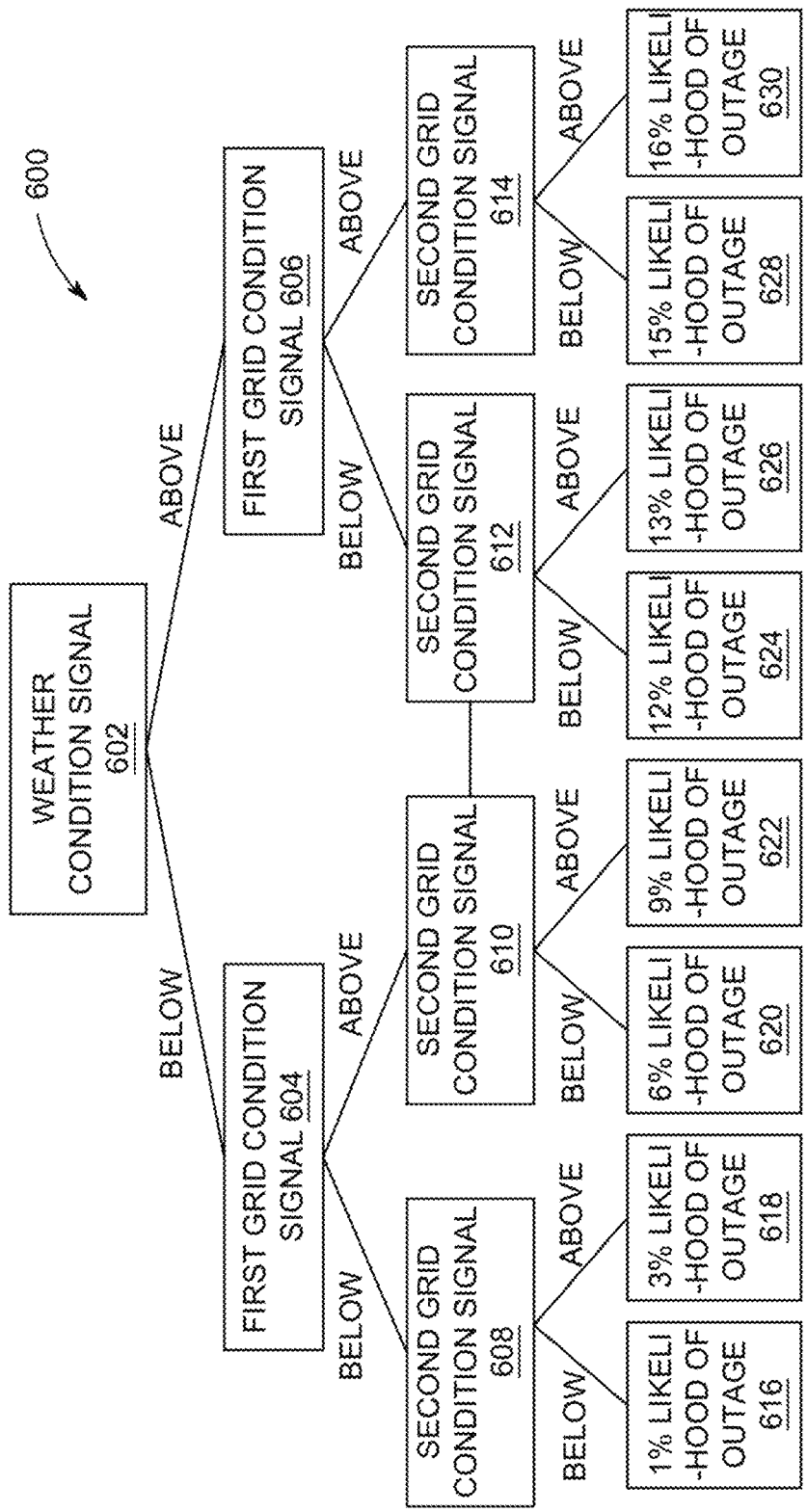
FIGS. 9 and 10 illustrate various algorithms that can be used with different embodiments of the present invention.

In one embodiment, block 506 of method 500 can be implemented in many different ways to analyze grid condition signals. One example such technique that can be used is a decision tree algorithm. FIG. 9 illustrates an example decision tree 600 consistent with certain implementations. Decision tree 600 will be discussed in the context of predicting a likelihood of a grid outage. However, decision trees or other algorithms can provide many different outputs related to grid failure probability, e.g., a severity rating on a scale of 1-10, a binary yes/no, predicted failure duration, predicted time of grid failure, etc.

In one embodiment, decision tree 600 starts with a weather condition signal node 602. For example, this node can represent current weather conditions at a given data center, such as a wind speed. When the wind speed is below a given wind speed threshold, the decision tree goes to the left of node 602 to first grid condition signal node 604. When the wind speed is above the wind speed threshold, the decision tree goes to the right of node 602 to first grid condition signal node 606.

In one embodiment, the direction taken from first grid condition signal node 604 and 606 can depend on the first grid condition signal. For the purposes of this example, let the first grid condition signal quantify the extent to which voltage on the grid deviates from a specified grid voltage that a grid operator is trying to maintain. The first grid condition signal thus quantifies the amount that the current grid voltage is above or below the specified grid voltage. When the voltage lag is below a certain voltage threshold (e.g., 0.05%), the decision tree goes to the left of node 604/606, and when the voltage disparity exceeds the voltage threshold, the decision tree goes to the right of these nodes.

In one embodiment, the decision tree operates similarly with respect to second grid condition signal nodes 608, 610, 612, and 614. For the purposes of this example, let the second grid condition signal quantify the extent to which power factor deviates from unity on the grid. When the power factor does not deviate more than a specified power factor threshold from unity, the paths to the left out of nodes 608, 610, 612, and 614 are taken to nodes 616, 620, 624, and 628. When the power factor does deviate from unity by more than the power factor threshold, the paths to the right of nodes 608, 610, 612, and 614 are taken to nodes 618, 622, 626, and 630.

In one embodiment, leaf nodes 616-630 represent predicted likelihoods of failure events for specific paths through decision tree 600. Consider leaf node 616, which represents the likelihood of a grid failure event taken when the wind speed is below the wind speed threshold, the current grid voltage is within the voltage threshold of the specified grid voltage, and power factor is within the power factor threshold of unity. Under these circumstances, the likelihood of a grid failure event, e.g., in the next hour may be relatively low. The general idea here is that all three indicia of potential grid problems (wind speed, voltage, and power factor) indicate that problems are relatively unlikely.

In one embodiment, there are many different specific algorithms that can be used to predict the likelihood of a grid failure event. Decision tree 600 discussed above is one example of such an algorithm.

Figure 10:
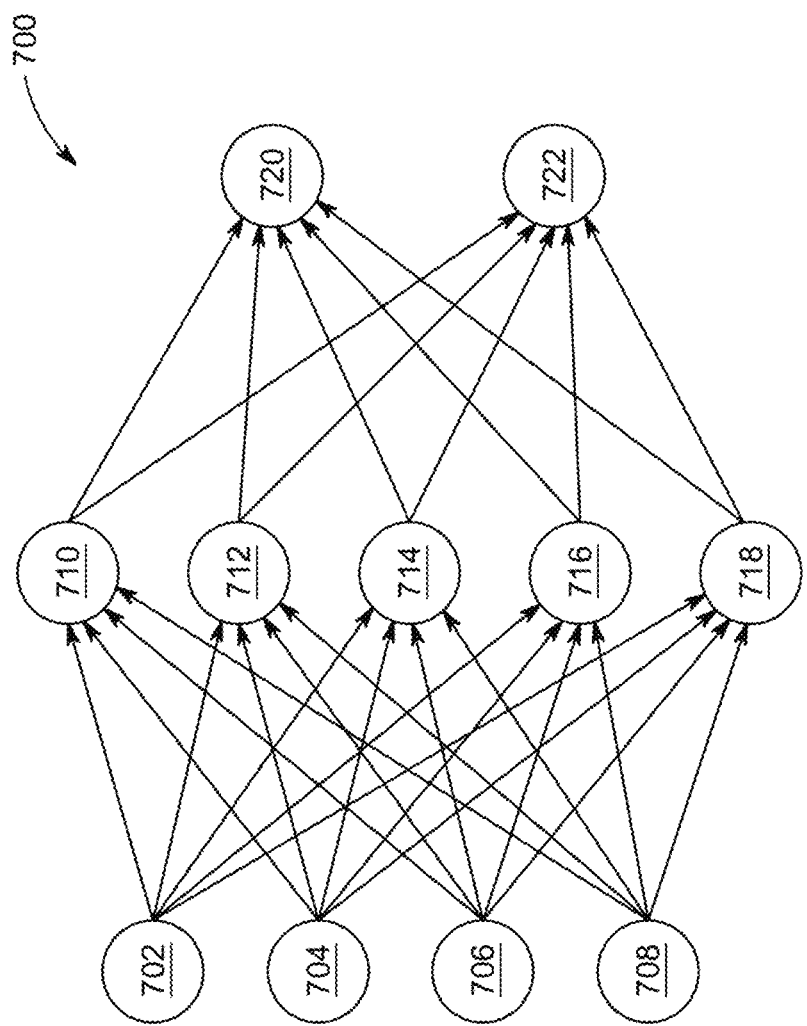

FIG. 10 illustrates another such algorithm, a learning network 700 such as a neural network. Generally, learning network 700 can be trained to classify various signals as either likely to lead to failure or not likely to lead to failure.

In one embodiment, learning network 700 includes various input nodes 702, 704, 706, and 708 that can represent the different signals discussed herein. For example, input node 702 can represent power factor on a given grid, e.g., quantify the deviation of the power factor from unity. Input node 704 can represent voltage on the grid, e.g., can quantify the deviation of the voltage on the grid from the specified voltage. Input node 706 can represent a first weather condition on the grid, e.g., can represent wind speed. Input node 708 can represent another weather condition on the grid, e.g., can represent whether thunder and lightning are occurring on the grid.

In one embodiment, nodes 710, 712, 714, 716, and 718 can be considered "hidden nodes" that are connected to both the input nodes and output nodes 720 and 722. Output node 720 can represent a first classification of the input signals, e.g., output node 720 can be activated when a grid outage is relatively unlikely. Output node 722 can represent a second classification of the input signals, e.g., output node 722 can be activated instead of node 720 when the grid outage is relatively likely.

As non-limiting examples, decision tree 600 and learning network 700 are two examples of various algorithms that can be used to predict the probability of a given grid failure event. Other algorithms include probabilistic (e.g., Bayesian) and stochastic methods, genetic algorithms, support vector machines, regression techniques, etc. The following describes a general approach that can be used to train such algorithms to predict grid failure probabilities.

As non-limiting examples, blocks 502 and 504 can include obtaining grid condition signals from different grids. These grid condition signals can be historical signals obtained over times when various failures occurred on the grids, and thus can be mined to detect how different grid conditions suggest that future failures are likely. In addition, other historical signals such as weather signals and data center node 12 signals can also be obtained. The various historical signals for the different grids can be used as training data to train the algorithm. For example, in the case of the decision tree 600, the training data can be used to establish the individual thresholds used to determine which path is taken out of each node of the tree. In the case of the learning network 700, the training data can be used to establish weights that connect individual nodes of the network. In some cases, the training data can also be used to establish the structure of the decision tree and/or network.

In one embodiment, once the algorithm is trained, current signals for one or more grids can be evaluated to predict the likelihood of grid failures on those grids. For example, current grid conditions and weather conditions for many different grids can be evaluated, and individual grids can be designated as being at relatively high risk for a near-term failure. The specific duration of the prediction can be predetermined or learned by the algorithm, e.g., some implementations may predict failures on a very short time scale (e.g., within the next second) whereas other implementations may have a longer prediction horizon (e.g., predicted failure within the next 24 hours).

In one embodiment, the trained algorithm may take into account correlations between grid failures on different grids. For example, some grids may tend to experience failure events shortly after other grids. This could be due to a geographical relationship, e.g., weather patterns at one grid may tend to reliably appear at another grid within a fairly predictable time window. In this case, a recent grid failure at a first grid may be used to predict an impending grid failure on a second grid.

In one embodiment, failure correlations may exist between different grids for other reasons besides weather. For example, relationships between different grids can be very complicated and there may be arrangements between utility companies for coordinated control of various grids that also tend to manifest as correlated grid failures. Different utilities may tend to take various actions on their respective grids that tend to cause failures between them to be correlated.

As a non-limiting example, there may also be physical connections between different grids that tend to cause the grids to fail together. For example, many regional grids in very different locations may both connect to a larger interconnect grid. Some of these regional grids may have many redundant connections to one another that enables them to withstand grid disruptions, whereas other regional grids in the interconnect grid may have relatively fewer redundant connections. The individual regional grids with less redundant connectivity may tend to experience correlated failures even if they are geographically located very far from one another, perhaps due to conditions present on the entire interconnect. Thus, in some cases, the algorithms take into account grid connectivity as well.

As non-limiting examples, a way to represent correlations between grid failures is using conditional probabilities. As a non-limiting example, consider three grids A, B, and C. If there have been 100 failures at grid A in the past year and 10 times grid C suffered a failure within 24 hours of a grid A failure, then this can be expressed as a 10% conditional probability of a failure at grid C within 24 hours of a failure at grid A. Some implementations may combine conditional probabilities, e.g., by also considering how many failures occurred on grid B and whether subsequent failures occurred within 24 hours on grid C. If failures on grid C tend to be highly correlated with both failures on grid A and failures on grid B, then recent failure events at both grids A and B can be stronger evidence of a likely failure on grid C than a failure only on grid A or only on grid B.

In one embodiment, illustrated in FIG. 9, tree 600 is shown outputting failure probabilities and in FIG. 10, learning network 700 is shown outputting a binary classification of either low failure risk (activate node 720) or high failure risk (activate node 722). These outputs are merely examples and many different possible algorithmic outputs can be viewed as predictive of the likelihood of failure on a given grid.

As a non-limiting example, some algorithms can output not only failure probabilities, but also the expected time and/or duration of a failure. The expected duration can be useful because there may be relatively short-term failures that a given data center can handle with local energy storage, whereas other failures may require on-site power generation. If for some reason it is disadvantageous (e.g., expensive) to turn on local power generation at a data center, the data center may take different actions depending on whether on-site power generation is expected to be needed.

For example, assume the algorithm predicts that there is an 80% chance that a failure will occur but will not exceed 30 minutes. If the data center has enough stored energy to run for 50 minutes, the data center may continue operating normally. This can mean the data center leaves local generators off, leaves data center nodes 12 in their current power consumption states, and does not transfer jobs to other data centers. On the other hand, if the algorithm predicts there is an 80% chance that the failure will exceed 50 minutes, the data center might begin to transfer jobs to other data centers, begin turning on local generators, etc.

As a non-limiting example, many different grids are evaluated concurrently and data centers located on these individual grids can be coordinated. For example, refer back to FIG. 4. Assume that failures at data center 424 and 444 are very highly correlated, and that a failure has already occurred at data center 424. In isolation, it may make sense to transfer jobs from data center 444 to data center 428. However, it may be that failures at data center 428 are also correlated to failures at data center 424, albeit to a lesser degree. Intuitively, this could be due to relationships shown in hierarchy 400, e.g., both data centers 424 and 428 are connected to grid 406.

In one embodiment, grid failure predictions are applied by implementing policies about how to control local data center nodes 12 and power hardware without consideration of input from the grid operator. This may be beneficial from the standpoint of the data center, but not necessarily from the perspective of the grid operator. Thus, in some implementations, the specific actions taken by a given data center can also consider requests from the grid operator.

As a non-limiting example, in some cases, a grid operator may explicitly request that a given data center reduce its power consumption for a brief period to deal with a temporary demand spike on a given grid. In other cases, a grid operator may explicitly request that a given data center turn on its fossil fuel generators to provide reactive power to a given grid to help with power factor correction on that grid. These requests can influence which actions a given data center is instructed to take in response to predicted failure events.

As a non-limiting example, assume data centers 424 and 428 both receive explicit requests from a grid operator of grid 406 to reduce their power consumption to help address a temporary demand spike on grid 406. The control system 110 may obtain signals from data center 424 resulting in a prediction that a grid failure is relatively unlikely for consumers connected to substation 412, whereas signals received from data center 428 may result in a prediction that a grid failure is very likely for consumers connected to substation 414. Under these circumstances, the control system 110 may instruct data center 424 to comply with the request by reducing its net power consumption—discharging batteries, placing data center nodes 12 into low-power consumption states, turning on generators, etc. On the other hand, the control system 110 may determine that the risk of grid failure at data center 428 is too high to comply with the request and may instead instruct data center 428 begin charging its batteries and place additional data center nodes 12 into higher power consumption states in order to accomplish as much computation work as possible before the failure and/or transfer jobs to a different data center before the predicted failure.

In cases such as those shown in FIG. 5 where a given data center is configured to provide net power to the grid, this approach can be taken further. In this example, the control system 110 can instruct data center 424 to provide net power to the grid in response to the request. In some cases, the grid operator may specify how much net power is requested and data center 424 may be instructed to take appropriate actions to provide the requested amount of power to the grid. Specifically, the control system 110 may determine various energy hardware actions and server actions that will cause the data center 424 to provide the requested amount of power to the grid.

In one embodiment, the various modules shown in FIG. 4 can be installed as hardware, firmware, or software during manufacture of the device or by an intermediary that prepares the device for sale to the end user. In other instances, the end user may install these modules later, such as by downloading executable code and installing the executable code on the corresponding device. Also note that devices generally can have input and/or output functionality. For example, computing devices can have various input mechanisms such as keyboards, mice, touchpads, voice recognition, etc. Devices can also have various output mechanisms such as printers, monitors, etc.

In one embodiment, the devices described herein can function in a stand-alone or cooperative manner to implement the described techniques. For example, method 500 can be performed on a single computing device and/or distributed across multiple computing devices that communicate over network(s) 120. Without limitation, network(s) 120 can include one or more local area networks (LANs), wide area networks (WANs), the Internet, and the like.

As a non-limiting example, the control system 110 can manipulate the computational resources used for computing jobs at a given data center. The term "computational resources" broadly refers to individual computing devices, storage, memory, processors, virtual machines, time slices on hardware or a virtual machine, computing jobs/tasks/processes/threads, etc. Any of these computational resources can be manipulated in a manner that affects the amount of power consumed by a data center at any given time.

Figure 11:
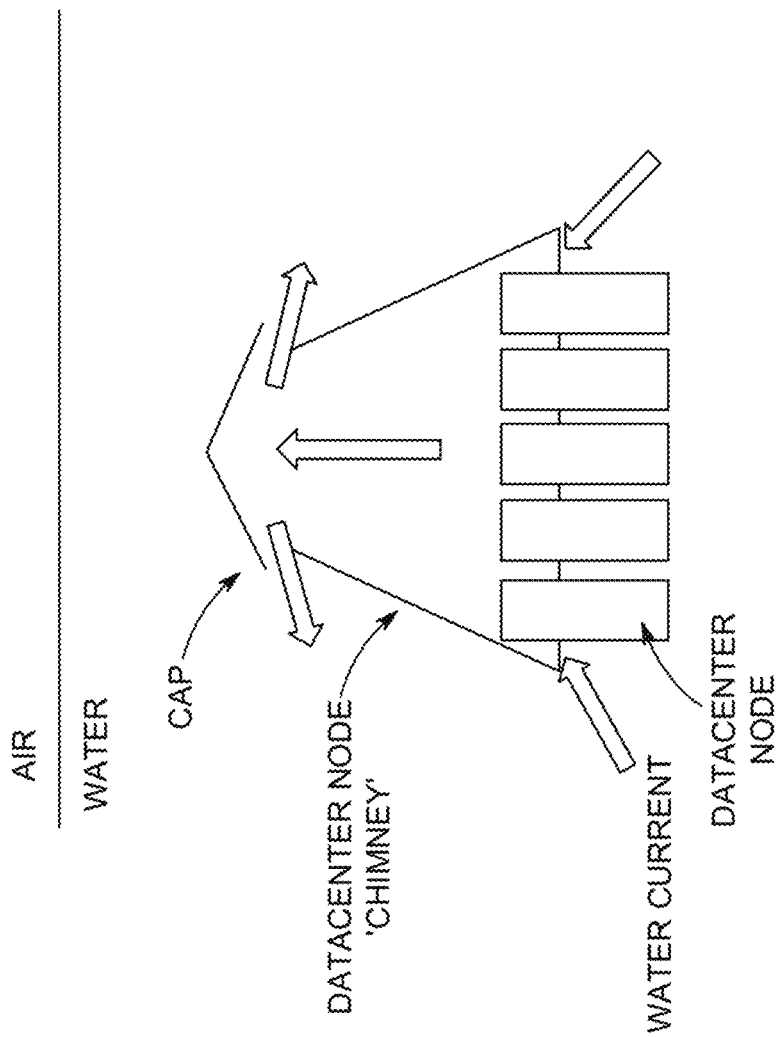
FIG. 11 illustrates one embodiment of passive cooling, where the passive cooling is operating by at least one of convention or conduction without moving fluid.

FIG. 11 illustrates one embodiment of passive cooling, the passive cooling operating by at least one of convention or conduction without moving fluid in housing 22.

Figure 12:
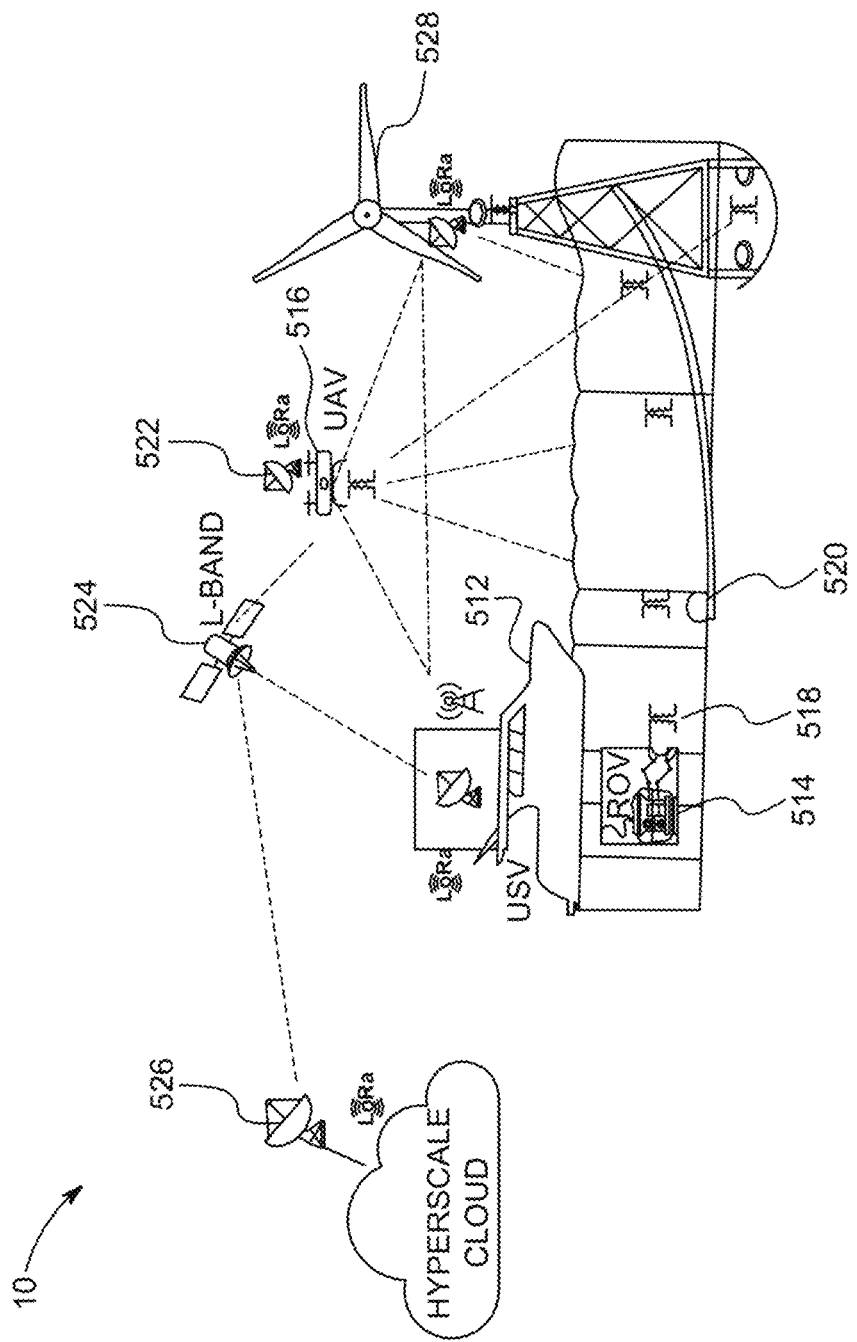
FIG. 12 illustrates one embodiment of autonomous offshore operations.

FIG. 12 illustrates one embodiment of autonomous offshore operations. As a non-limiting example, system 10 can include or be coupled to an unmanned surface vehicle 512, one or more remote operated vehicles 514, one or more unmanned aerial vehicles 516, a lattice wireless information transfer system 518, a lattice smart edge device 520 that can include ML, AI and the like, a lower power wide-area network modulation system 522, satellite system 524 that can be L-band, a receiver 526 and a sustainable energy source including but not limited to a wind power generating system 528 such as the one disclosed in FIG. 2.

Figure 13:
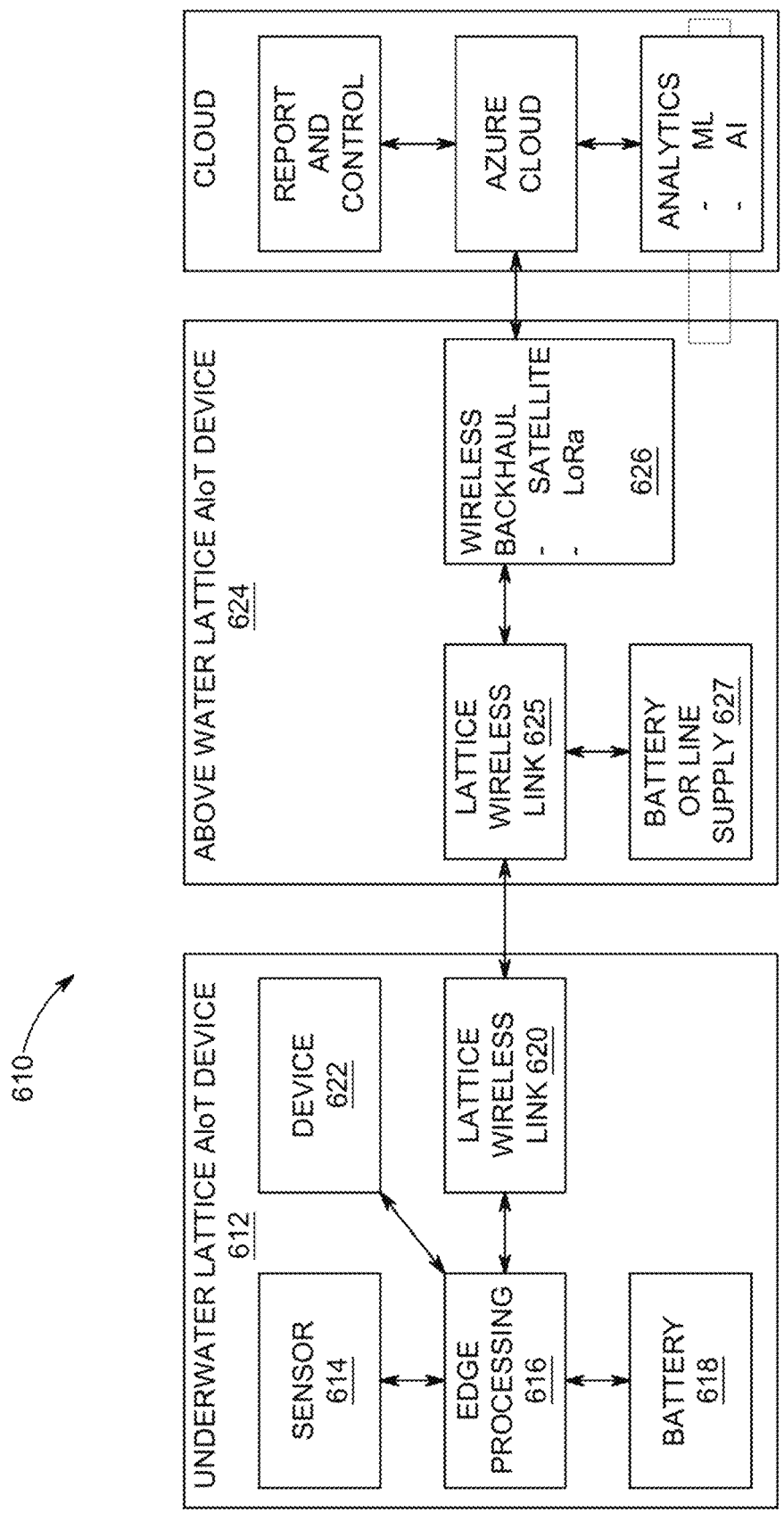
FIG. 13 illustrated one embodiment of an end-to-end azure IoT service for wind power generating system.

In one embodiment, the wind power generating system includes the following: a nacelle, a tower structure and one of a foundation and a mooring system FIG. 13 illustrated one embodiment of an end-to-end azure IoT service 610 for wind power generating system 528. As non-limiting examples, an underwater lattice AIoT device 612 can include a sensor 614 coupled to an edge processing system 616 that is coupled to a power source 618 including but not limited to a battery and the like. As a non-limiting example, edge processing system 616 is coupled to a lattice wireless link 620 and to a device 622 including but not limited to a switch; a motor; an actuator; and the like.

Figure 14:
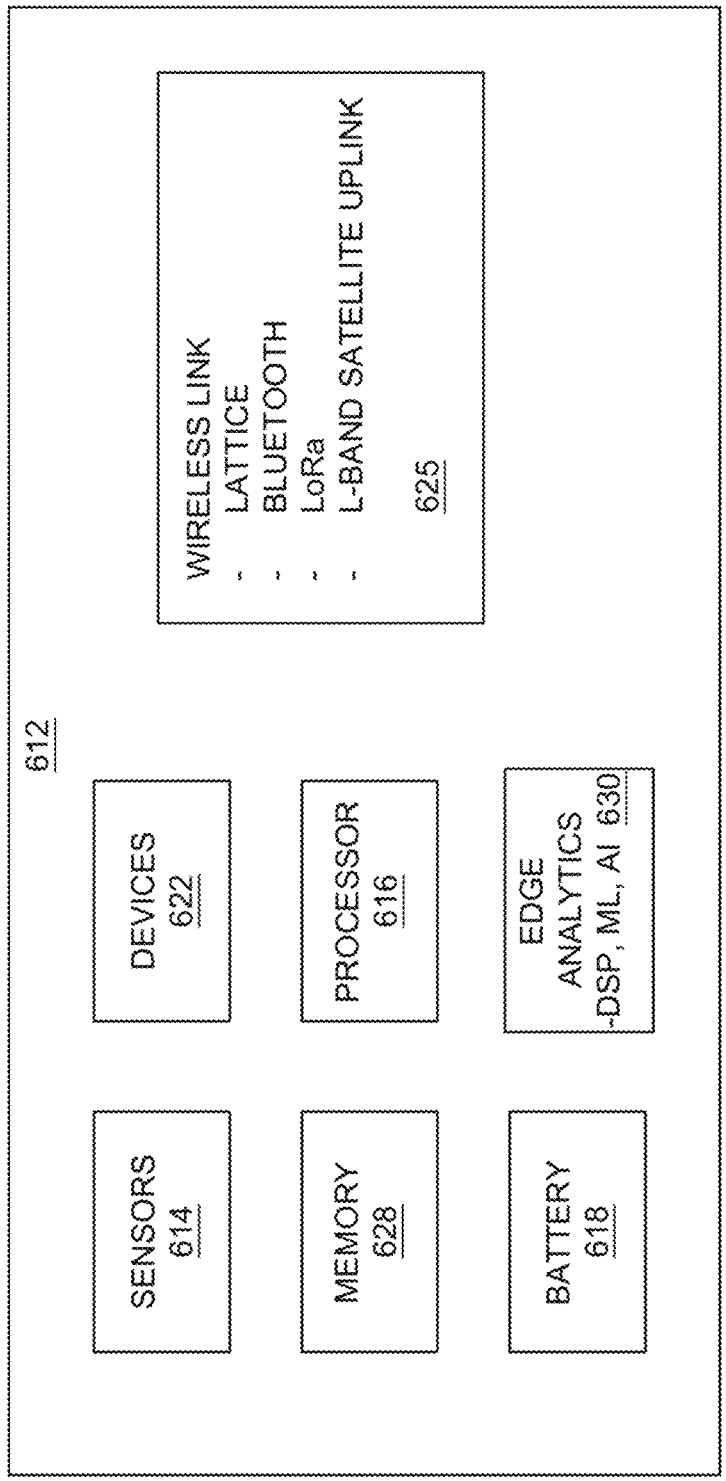
FIG. 14 illustrates one embodiment of an underwater lattice AIoT device coupled to an above water lattice AIoT device.

Referring to FIG. 14, underwater lattice AIoT device 612 is coupled to an above water lattice AIoT Device 624 that includes a lattice wireless link 624 coupled to a wireless backhaul 626 including but not limited to satellite system 524, and lower power wide-area network modulation system 522. Lattice wireless link 625 is coupled to a battery or line supply 627 and lattice wireless link 620.

In one embodiment, wireless backhaul 625 is coupled a cloud service such as but not limited to the Azure of cloud 630 cloud 630 includes a report and control system 632 and an analytics system 634 that can include ML, AI and the like.

Figure 15:
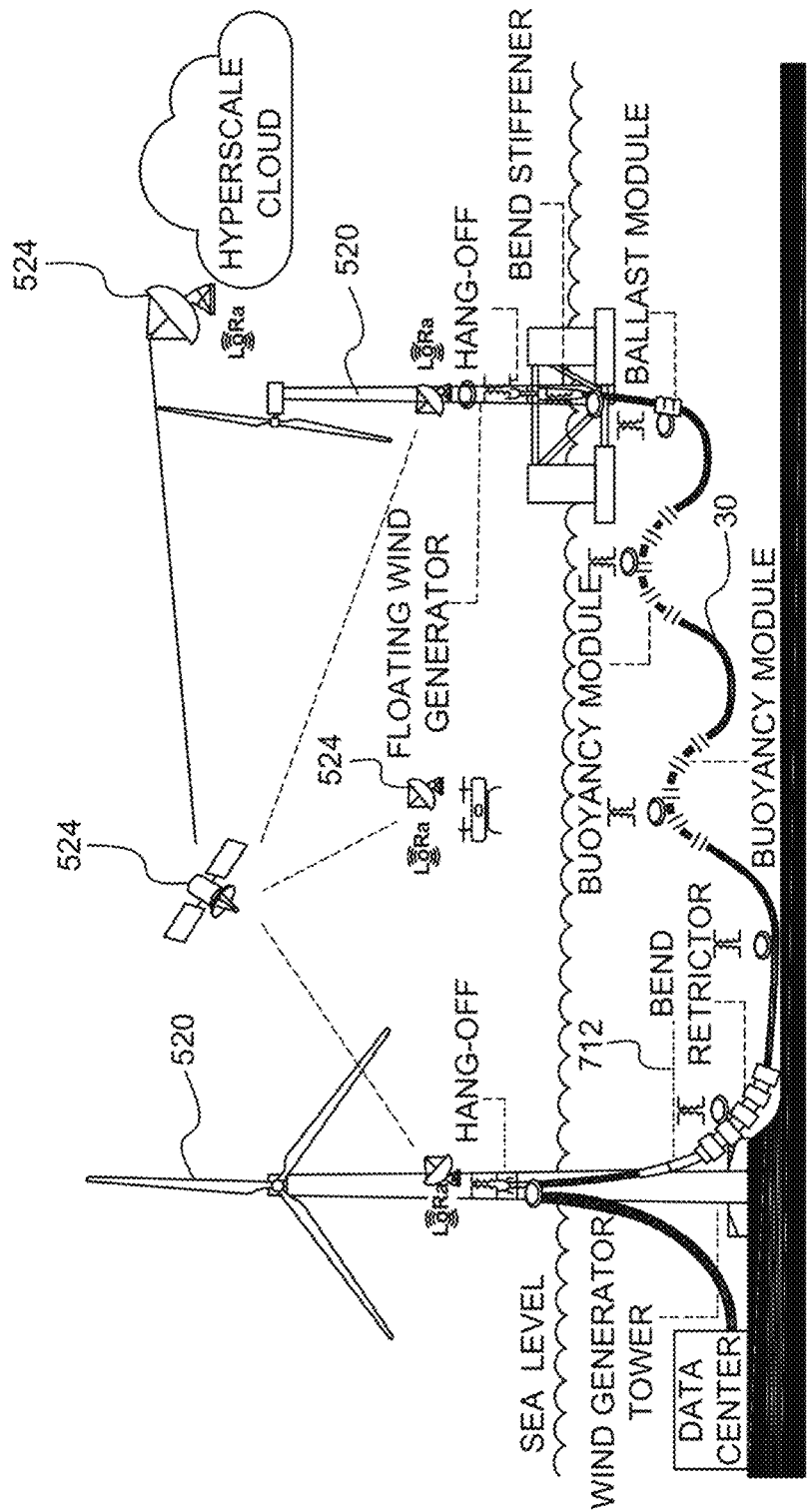
FIG. 15 illustrates one embodiment of a lattice AIoT Device

In one embodiment, illustrated in FIG. 15, lattice AIot Device 612 includes sensors 624, memory 628, battery 618, edge analytics 630, processor 616, devices 622, wireless links 625 and the like.

In one embodiment, an underwater data center includes a plurality of data centers positioned in a water environment, powered by one or more sustainable energy sources. One or more data center nodes is coupled to the data center or included in the plurality of data centers. A controller is coupled to the one or more data center nodes. A housing member houses the data center node under water. A passive cooling system coupled to plurality of data centers. The passive cooling operates by at least one of convention or conduction without moving fluid in the housing. The plurality of data centers is coupled to a sustainable energy source that provides energy to the underwater data center. The controller is configured to redistribute excess power from the sustainable energy source to an alternate source responsive to determine that the power from the sustainable energy source is greater than an amount needed to power the system.

As a non-limiting example, the plurality of data centers is an offshore energy mall, and can include an anchor data center.

In one embodiment, the date center system 10 is at a secure location. The date center system 10 can have restricted access.

In one embodiment, the date center system 10 has hardware to provide for automated management. The date center system 10 can include or is coupled to a resilient power supply. The data center system, can include or is coupled to a resilient network. The date center system 10 can be scalable.

In one embodiment, the date center system 10 is clustered. It can be resilient to external events.

In one embodiment, the date center system 10 operates at a low operating temperature. As a non-limiting example, this can be below 30° C.

As a non-limiting example, the date center system 10 provides improved reliability of electronics. As a non-limiting example, this can an improvement of ×5 or more as a result of reduced operating temperature.

In one embodiment, date center system 10 includes sealed for life subsea blades. The electronics can be positioned in non-metallic enclosures and all entrances to this enclosure are fused, rendering the device 'sealed-for-life'

In one embodiment, date center system 10 provides end to end autonomous operations. This can be achieved using factory automation techniques and/or autonomous vehicles to remove the need for human intervention to undertake most maintenance, repair and support tasks In one embodiment, date center system 10 provides a global business as the need for data center systems is growing globally. The most challenging placed to install and operate data center systems is in the developing world where power and fiber optic infrastructure are often poor. Data center systems allows their establishment to be established more easily in all parts of the world regardless of availability of infrastructure.

As a non-limiting example, data center systems are placed near the source of power. This improves efficiency and reduces cost. In one embodiment, data center systems are placed near the communities that use them and thus provides value-add jobs. The presence of a low environmental footprint and highly secure data center systems opens the way for a range of new businesses, including but not limited to: blockchain; highly secure financial services; military and the like.

As a non-limiting example, date center system 10 reduces strain on a local infrastructure by removing the need for supply of high-quality power e.g., 100 MW+ and/or high-quality fiber.

In one embodiment, data center systems are customers to an offshore energy operator. Long term contracts are then used to supply large quantities of high-quality energy.

In one embodiment, data center systems are part of a package that upgrades the regional IT infrastructure without adding to the burden of onshore power and comms systems.

Figure 16:
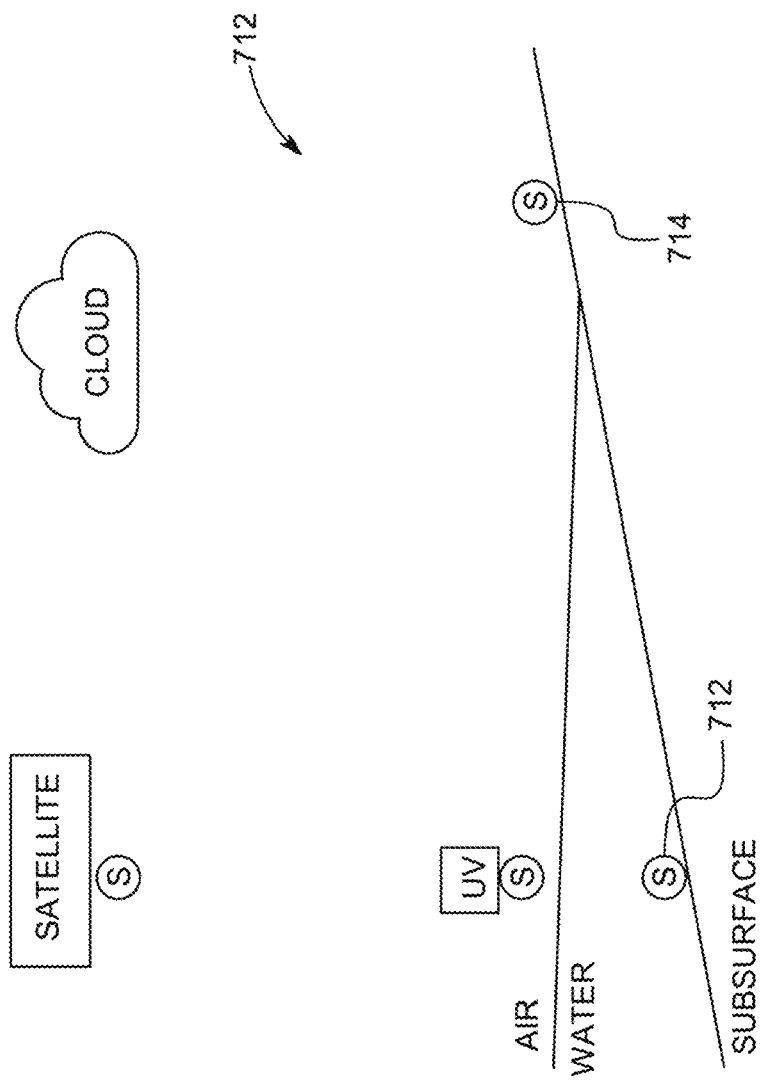
FIG. 16 illustrates one embodiment on an underwater data center with an environmental information system.

FIG. 16 illustrates one embodiment on an underwater data center subsystem with an environmental information system 712. Environmental information system 712 includes a fusion of information form a plurality of sources including but not limited to subsea; satellite; aerial; land sensors and the like. As non-limiting examples, satellite sensors include but not limited to: temperature; salinity such as microwave imaging radiometer (ESA, MIras); dissolved oxygen including a spectro-radiometer/visible IR radiometer; a gradiometer such as deep ocean, circulation; spectroscopy for soil composition, and the like.

In one embodiment, information derived from subsea sensor data is used to calibrate predictive models (digital twins). This information is optionally made available to satellite sensor systems to improve calibration.

As non-limiting examples, the environmental information system 712 can measure a temperature of a water surface. In one embodiment, temperature sensors in a water column can be used to derive a model of the relationship between water surface and a temp in the column In other embodiments, the environmental information system 712 can be used for one or more of: environmental surveillance e.g., mangroves, seagrass and the like; aquaculture; meteorological; carbon sequestration monitoring and measurement; and the like.

It is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. An underwater data center system, comprising:
   a data center positioned in a water environment, powered by one or more sustainable energy sources;
   one or more data center nodes coupled to the data center;
   a controller coupled to the one or more data center nodes;
   a housing member that houses the data center nodes under water;
   one or more cables coupled to the one or more data center nodes or the sustainable energy source;
   an environmental information system including at least two sensors selected from:
   subsea; satellite; aerial; and land sensors, and
   wherein information derived from subsea sensor data is used to calibrate predictive models and is made available to satellite sensor systems to improve calibration.

2. The system of claim 1, wherein the satellite sensors are selected from: temperature; salinity; dissolved oxygen; gradiometer; and spectroscopy.

3. The system of claim 1, wherein information derived from subsea sensor data is used to calibrate predictive models relative to environemental information of the system.

4. The system of claim 1, wherein the sustainable energy source is an offshore energy generation source.

5. The system of claim 1, wherein the environmental information system provides a temperature of a water surface.

6. The system of claim 1, wherein the controller is configured to redistribute excess power from the sustainable energy source to an alternate source responsive to determining that the power from the sustainable energy source is greater than an amount needed to power the system.

7. The system of claim 1, wherein a cooling fluid is provided that is a dielectric fluid, and wherein components of the data center or partial data center are submerged in the dielectric fluid.

8. The system of claim 7, wherein the cooling fluid is a dielectric fluid.

9. The system of claim 1, further comprising:
   a thermal transfer system coupled to or incorporated in the data center or partial data center.

10. The system of claim 1, wherein the sustainable energy source is a renewable energy source.

11. The system of claim 10, further comprising:
    a unit transformer coupled to an interface.

12. The system of claim 1, wherein the sustainable energy source is an energy source selected from at least one of: renewable energy; off shore energy generation; wind; hydroelectric; solar; geothermal; conversion of energy to one or more of hydrogen, or ammonia.

13. The system of claim 12, further comprising:
    a unit controller coupled to the interface to provide reactive power and terminal voltage control commands.

14. The system of claim 1, wherein the data center is configured to operate with a minimal data load by using an architecture with data being data is processed at the source and only information is transferred to the data center.

15. The system of claim 1, where the data center uses wireless link to remove costs and carbon footprint of hard-wired link.

16. The system of claim 1, wherein the data center uses edge processing.

17. The system of claim 1, wherein the sustainable energy source is an off shore wind power generating system that includes a wind turbine.

18. The system of claim 1, wherein the wind turbine uses wind interaction with blades.

19. The system of claim 1, wherein the system is coupled to a wireless device.

* * * * *